(12) United States Patent
Wells

(10) Patent No.: US 10,396,281 B2
(45) Date of Patent: *Aug. 27, 2019

(54) METHODS FOR FORMING ARRAYS OF SMALL, CLOSELY SPACED FEATURES

(71) Applicant: MICRON TECHNOLOGY, INC., Boise, ID (US)

(72) Inventor: David H. Wells, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/754,172

(22) Filed: Jun. 29, 2015

(65) Prior Publication Data

US 2015/0325791 A1 Nov. 12, 2015

Related U.S. Application Data

(60) Continuation of application No. 14/094,482, filed on Dec. 2, 2013, now Pat. No. 9,082,829, which is a
(Continued)

(51) Int. Cl.
*G06F 17/50* (2006.01)
*H01L 45/00* (2006.01)
(Continued)

(52) U.S. Cl.
CPC ...... *H01L 45/1691* (2013.01); *H01L 21/0337* (2013.01); *H01L 21/31144* (2013.01);
(Continued)

(58) Field of Classification Search
CPC ......... H01L 2924/0002; H01L 2924/00; H01L 27/1052; H01L 21/76802; H01L 21/76885;
(Continued)

(56) References Cited

U.S. PATENT DOCUMENTS 4,234,362 A 11/1980 Riseman
4,419,809 A 12/1983 Riseman et al.
(Continued)

FOREIGN PATENT DOCUMENTS

DE 42 36 609 A1 5/1994
EP 0 227 303 A2 7/1987
(Continued)

OTHER PUBLICATIONS

Bergeron, et al. "Resolution Enhancement Techniques for the 90nm Technology Node and Beyond," Future Fab International, Issue 15, Jul. 11, 2003, 4 Pages.
(Continued)

*Primary Examiner* — Binh C Tat
(74) *Attorney, Agent, or Firm* — Wells St. John P.S.

(57) ABSTRACT

Methods of forming arrays of small, densely spaced holes or pillars for use in integrated circuits are disclosed. Various pattern transfer and etching steps can be used, in combination with pitch-reduction techniques, to create densely-packed features. Conventional photolithography steps can be used in combination with pitch-reduction techniques to form superimposed patterns of crossing elongate features with pillars at the intersections. Spacers are simultaneously applied to sidewalls of both sets of crossing lines to produce a pitch-doubled grid pattern. The pillars facilitate rows of spacers bridging columns of spacers.

19 Claims, 16 Drawing Sheets

Related U.S. Application Data division of application No. 13/548,077, filed on Jul. 12, 2012, now Pat. No. 8,601,410, which is a division of application No. 12/498,951, filed on Jul. 7, 2009, now Pat. No. 8,266,558, which is a division of application No. 11/217,270, filed on Sep. 1, 2005, now Pat. No. 7,572,572.

(51) Int. Cl.

| | | |
|---|---|---|
| *H01L 27/10* | (2006.01) | |
| *H01L 27/102* | (2006.01) | |
| *H01L 27/112* | (2006.01) | |
| *H01L 27/105* | (2006.01) | |
| *H01L 21/768* | (2006.01) | |
| *H01L 21/033* | (2006.01) | |
| *H01L 21/311* | (2006.01) | |
| *H01L 27/115* | (2017.01) | |

(52) U.S. Cl.
CPC .. *H01L 21/76802* (2013.01); *H01L 21/76816* (2013.01); *H01L 21/76885* (2013.01); *H01L 27/101* (2013.01); *H01L 27/1021* (2013.01); *H01L 27/1052* (2013.01); *H01L 27/112* (2013.01); *H01L 27/11206* (2013.01); *H01L 45/06* (2013.01); *H01L 45/085* (2013.01); *H01L 45/124* (2013.01); *H01L 45/144* (2013.01); *H01L 45/149* (2013.01); *H01L 45/1608* (2013.01); *H01L 45/1683* (2013.01); *H01L 21/31122* (2013.01); *H01L 21/31138* (2013.01); *H01L 27/115* (2013.01)

(58) Field of Classification Search
CPC . H01L 27/101; H01L 27/1021; H01L 27/112; H01L 27/11206; H01L 27/115; H01L 45/06; H01L 45/085; H01L 45/124; H01L 21/50; H01L 23/10; H01L 27/14618; H01L 21/0338; H01L 2924/09701; H01L 21/3088; H01L 27/0207; H01L 21/0337; H01L 21/31144; H01L 21/76816; H01L 21/31122; H01L 21/31138; H01L 27/10894; H01L 29/205; H01L 33/0066; H01L 21/6835; H01L 27/15; H01L 29/66916; H01L 27/0605; H01S 5/0217; H01S 5/34333; H01S 2301/173; H01S 5/4025; H01S 5/0201; H01S 5/0215; G02B 6/262; G02B 6/12002; Y10S 438/947
USPC .................................................. 716/100–106
See application file for complete search history.

(56) References Cited

U.S. PATENT DOCUMENTS

| | | | |
|---|---|---|---|
| 4,432,132 A | 2/1984 | Kinsbron et al. | |
| 4,502,914 A | 3/1985 | Trumpp et al. | |
| 4,508,579 A | 4/1985 | Goth et al. | |
| 4,648,937 A | 3/1987 | Ogura et al. | |
| 4,716,131 A | 12/1987 | Okazawa et al. | |
| 4,776,922 A | 10/1988 | Bhattacharyya et al. | |
| 4,803,181 A | 2/1989 | Buchmann et al. | |
| 4,838,991 A | 6/1989 | Cote et al. | |
| 5,013,680 A | 5/1991 | Lowrey et al. | |
| 5,047,117 A | 9/1991 | Roberts | |
| 5,053,105 A | 10/1991 | Fox, III | |
| 5,117,027 A | 5/1992 | Bernhardt et al. | |
| 5,328,810 A | 7/1994 | Lowrey et al. | |
| 5,330,879 A | 7/1994 | Dennison | |
| 5,470,661 A | 11/1995 | Bailey et al. | |
| 5,514,885 A | 5/1996 | Myrick | |
| 5,593,813 A | 1/1997 | Kim | |
| 5,670,794 A | 9/1997 | Manning | |
| 5,753,546 A | 5/1998 | Koh et al. | |
| 5,789,320 A | 8/1998 | Andricacos et al. | |
| 5,795,830 A | 8/1998 | Cronin et al. | |
| 5,830,332 A | 11/1998 | Babich et al. | |
| 5,858,620 A | 1/1999 | Ishibashi et al. | |
| 5,895,740 A | 4/1999 | Chien et al. | |
| 5,899,746 A | 5/1999 | Mukai | |
| 5,933,742 A | 8/1999 | Wu | |
| 5,998,256 A | 12/1999 | Juengling | |
| 6,004,862 A | 12/1999 | Kim et al. | |
| 6,010,946 A | 1/2000 | Hisamune et al. | |
| 6,020,255 A | 2/2000 | Tsai et al. | |
| 6,042,998 A | 3/2000 | Brueck et al. | |
| 6,057,573 A | 5/2000 | Kirsch et al. | |
| 6,060,383 A | 5/2000 | Nogami et al. | |
| 6,063,688 A | 5/2000 | Doyle et al. | |
| 6,071,789 A | 6/2000 | Yang et al. | |
| 6,110,837 A | 8/2000 | Linliu et al. | |
| 6,143,476 A | 11/2000 | Ye et al. | |
| 6,184,151 B1 * | 2/2001 | Adair | H01L 21/0332 257/E21.035 |
| 6,207,490 B1 | 3/2001 | Lee | |
| 6,211,044 B1 | 4/2001 | Xiang et al. | |
| 6,288,454 B1 | 9/2001 | Allman et al. | |
| 6,291,334 B1 | 9/2001 | Somekh | |
| 6,297,554 B1 | 10/2001 | Lin | |
| 6,335,257 B1 | 1/2002 | Tseng | |
| 6,348,380 B1 | 2/2002 | Weimer et al. | |
| 6,362,057 B1 | 3/2002 | Taylor, Jr. et al. | |
| 6,372,649 B1 | 4/2002 | Han et al. | |
| 6,383,907 B1 | 5/2002 | Hasegawa et al. | |
| 6,395,613 B1 | 5/2002 | Juengling | |
| 6,403,460 B1 | 6/2002 | Lin | |
| 6,423,474 B1 | 7/2002 | Holscher | |
| 6,455,372 B1 | 9/2002 | Weimer | |
| 6,500,756 B1 | 12/2002 | Bell et al. | |
| 6,514,884 B2 | 2/2003 | Maeda | |
| 6,522,584 B1 | 2/2003 | Chen et al. | |
| 6,531,067 B1 | 3/2003 | Shiokawa et al. | |
| 6,534,243 B1 | 3/2003 | Templeton | |
| 6,548,385 B1 | 4/2003 | Lai | |
| 6,548,396 B2 | 4/2003 | Naik et al. | |
| 6,559,017 B1 | 5/2003 | Brown et al. | |
| 6,566,280 B1 | 5/2003 | Meagley et al. | |
| 6,573,030 B1 | 6/2003 | Fairbairn et al. | |
| 6,602,779 B1 | 8/2003 | Li et al. | |
| 6,620,715 B1 | 9/2003 | Blosse et al. | |
| 6,627,824 B1 | 9/2003 | Lin | |
| 6,632,741 B1 | 10/2003 | Clevenger et al. | |
| 6,638,441 B2 | 10/2003 | Chang et al. | |
| 6,649,953 B2 | 11/2003 | Cha | |
| 6,667,237 B1 | 12/2003 | Metzler | |
| 6,673,684 B1 | 1/2004 | Huang et al. | |
| 6,686,245 B1 | 2/2004 | Mathew et al. | |
| 6,689,695 B1 | 2/2004 | Lui et al. | |
| 6,706,571 B1 | 3/2004 | Yu et al. | |
| 6,709,807 B2 | 3/2004 | Hallock et al. | |
| 6,730,571 B1 | 5/2004 | Chan et al. | |
| 6,734,107 B2 | 5/2004 | Lai et al. | |
| 6,744,094 B2 | 6/2004 | Forbes | |
| 6,762,449 B2 | 7/2004 | Uchiyama et al. | |
| 6,773,998 B1 | 8/2004 | Fisher et al. | |
| 6,794,699 B2 | 9/2004 | Bissey et al. | |
| 6,800,930 B2 | 10/2004 | Jackson et al. | |
| 6,818,141 B1 | 11/2004 | Plat et al. | |
| 6,835,662 B1 | 12/2004 | Erhardt et al. | |
| 6,867,116 B1 | 3/2005 | Chung | |
| 6,875,703 B1 | 4/2005 | Furukawa et al. | |
| 6,882,045 B2 * | 4/2005 | Massingill | H01L 21/486 257/528 |
| 6,893,972 B2 | 5/2005 | Rottstegge et al. | |
| 6,916,594 B2 | 7/2005 | Bok | |
| 6,924,191 B2 | 8/2005 | Liu et al. | |
| 6,955,961 B1 | 10/2005 | Cheng | |
| 6,962,867 B2 | 11/2005 | Jackson et al. | |
| 7,015,124 B1 | 3/2006 | Fisher et al. | |
| 7,074,668 B1 | 7/2006 | Park et al. | |

(56) References Cited

U.S. PATENT DOCUMENTS

| | | |
|---|---|---|
| 7,183,142 B2 | 2/2007 | Anderson et al. |
| 7,183,205 B2 | 2/2007 | Hong |
| 7,183,597 B2 | 2/2007 | Doyle |
| 7,202,174 B1 | 4/2007 | Jung |
| 7,208,379 B2 | 4/2007 | Venugopal et al. |
| 7,271,107 B2 | 9/2007 | Marks et al. |
| 7,288,445 B2 | 10/2007 | Bryant et al. |
| 7,291,560 B2 | 11/2007 | Parascandola et al. |
| 7,378,727 B2 | 5/2008 | Caspary et al. |
| 7,429,536 B2 | 9/2008 | Abatchev et al. |
| 7,442,976 B2 | 10/2008 | Juengling |
| 7,456,458 B2 | 11/2008 | Wang |
| 7,537,866 B2 | 5/2009 | Liu |
| 7,572,572 B2 * | 8/2009 | Wells .................... H01L 27/101 430/311 |
| 7,687,342 B2 | 3/2010 | Haller et al. |
| 7,851,135 B2 | 12/2010 | Jung |
| 8,266,558 B2 * | 9/2012 | Wells .................... H01L 27/101 716/126 |
| 8,278,223 B2 | 10/2012 | Kang |
| 8,601,410 B2 * | 12/2013 | Wells .................... H01L 27/101 716/55 |
| 2002/0042198 A1 | 4/2002 | Bjarnason et al. |
| 2002/0045308 A1 | 4/2002 | Juengling |
| 2002/0063110 A1 | 5/2002 | Cantell et al. |
| 2002/0068243 A1 | 6/2002 | Hwang et al. |
| 2002/0094688 A1 | 7/2002 | Mitsuiki |
| 2002/0127810 A1 | 9/2002 | Nakamura |
| 2003/0006410 A1 | 1/2003 | Doyle |
| 2003/0030090 A1 * | 2/2003 | Sasaki ............... H01L 27/10841 257/301 |
| 2003/0044722 A1 | 3/2003 | Hsu et al. |
| 2003/0090002 A1 | 5/2003 | Sugawara et al. |
| 2003/0109102 A1 | 6/2003 | Kujirai et al. |
| 2003/0119307 A1 | 6/2003 | Bekiaris et al. |
| 2003/0127426 A1 | 7/2003 | Chang et al. |
| 2003/0157436 A1 | 8/2003 | Manger et al. |
| 2003/0206680 A1 * | 11/2003 | Bakir .................... G01R 1/0491 385/14 |
| 2003/0207207 A1 | 11/2003 | Li |
| 2003/0207584 A1 | 11/2003 | Sivakumar et al. |
| 2003/0215978 A1 | 11/2003 | Maimon et al. |
| 2003/0216050 A1 | 11/2003 | Golz et al. |
| 2003/0230234 A1 | 12/2003 | Nam et al. |
| 2004/0000534 A1 | 1/2004 | Lipinski |
| 2004/0017989 A1 | 1/2004 | So |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0041189 A1 | 3/2004 | Voshell et al. |
| 2004/0043623 A1 | 3/2004 | Liu et al. |
| 2004/0053475 A1 | 3/2004 | Sharma |
| 2004/0079962 A1 * | 4/2004 | Kanechika ........ H01L 21/26506 257/163 |
| 2004/0079988 A1 | 4/2004 | Harari |
| 2004/0106257 A1 | 6/2004 | Okamura et al. |
| 2004/0127012 A1 * | 7/2004 | Jin .................... H01J 9/025 438/618 |
| 2004/0137729 A1 | 7/2004 | Norman |
| 2004/0235255 A1 | 11/2004 | Tanaka et al. |
| 2005/0074949 A1 | 4/2005 | Jung et al. |
| 2005/0087892 A1 | 4/2005 | Hsu et al. |
| 2005/0112812 A1 | 5/2005 | Jang |
| 2005/0112886 A1 | 5/2005 | Asakawa et al. |
| 2005/0136604 A1 * | 6/2005 | Al-Bayati ............ H01J 37/321 438/301 |
| 2005/0142497 A1 | 6/2005 | Ryou |
| 2005/0153562 A1 | 7/2005 | Furukawa et al. |
| 2005/0164454 A1 | 7/2005 | Leslie |
| 2005/0167394 A1 | 8/2005 | Liu et al. |
| 2005/0186705 A1 | 8/2005 | Jackson et al. |
| 2005/0202651 A1 * | 9/2005 | Akram .................... B28D 1/221 438/463 |
| 2005/0272259 A1 | 12/2005 | Hong |
| 2006/0003182 A1 | 1/2006 | Lane et al. |
| 2006/0011947 A1 | 1/2006 | Juengling |
| 2006/0024940 A1 | 2/2006 | Furukawa et al. |
| 2006/0024945 A1 | 2/2006 | Kim et al. |
| 2006/0046161 A1 | 3/2006 | Yin et al. |
| 2006/0046200 A1 | 3/2006 | Abatchev et al. |
| 2006/0046201 A1 | 3/2006 | Sandhu et al. |
| 2006/0046407 A1 | 3/2006 | Juengling |
| 2006/0046422 A1 | 3/2006 | Tran et al. |
| 2006/0046484 A1 | 3/2006 | Abatchev et al. |
| 2006/0083996 A1 | 4/2006 | Kim |
| 2006/0115978 A1 | 6/2006 | Specht |
| 2006/0172540 A1 | 8/2006 | Marks et al. |
| 2006/0180857 A1 | 8/2006 | Loechelt et al. |
| 2006/0189150 A1 | 8/2006 | Jung |
| 2006/0211260 A1 | 9/2006 | Tran et al. |
| 2006/0216923 A1 | 9/2006 | Tran et al. |
| 2006/0231900 A1 | 10/2006 | Lee et al. |
| 2006/0240361 A1 | 10/2006 | Lee et al. |
| 2006/0250593 A1 | 11/2006 | Nishi |
| 2006/0263699 A1 * | 11/2006 | Abatchev ............ H01L 21/0337 430/5 |
| 2006/0267075 A1 | 11/2006 | Sandhu et al. |
| 2006/0273456 A1 | 12/2006 | Sant et al. |
| 2006/0281266 A1 | 12/2006 | Wells |
| 2007/0026672 A1 | 2/2007 | Tang et al. |
| 2007/0040268 A1 | 2/2007 | Sherrer et al. |
| 2007/0045712 A1 | 3/2007 | Haller et al. |
| 2007/0045780 A1 * | 3/2007 | Akram .............. H01L 21/76898 257/621 |
| 2007/0048674 A1 | 3/2007 | Wells |
| 2007/0049011 A1 | 3/2007 | Tran |
| 2007/0049030 A1 | 3/2007 | Sandhu et al. |
| 2007/0049032 A1 | 3/2007 | Abatchev et al. |
| 2007/0049035 A1 | 3/2007 | Tran |
| 2007/0049040 A1 | 3/2007 | Bai et al. |
| 2007/0050748 A1 | 3/2007 | Juengling |
| 2007/0077524 A1 | 4/2007 | Koh |
| 2007/0148968 A1 | 6/2007 | Kwon et al. |
| 2007/0190762 A1 | 8/2007 | Franciscus Van Haren et al. |
| 2007/0200178 A1 | 8/2007 | Yun et al. |
| 2007/0210449 A1 | 9/2007 | Caspary et al. |
| 2007/0215874 A1 | 9/2007 | Furukawa et al. |
| 2007/0215960 A1 | 9/2007 | Zhu et al. |
| 2007/0275309 A1 | 11/2007 | Liu |
| 2008/0054350 A1 | 3/2008 | Breitwisch et al. |
| 2008/0057610 A1 | 3/2008 | Lee et al. |
| 2008/0081461 A1 | 4/2008 | Lee et al. |
| 2008/0292991 A1 | 11/2008 | Wallow |

FOREIGN PATENT DOCUMENTS

| | | |
|---|---|---|
| EP | 0 491 408 A2 | 6/1992 |
| EP | 1 357 433 A2 | 10/2003 |
| JP | 57-048237 | 3/1982 |
| JP | 64-035916 | 2/1989 |
| JP | 05-343370 | 12/1993 |
| JP | H08-55908 | 2/1996 |
| JP | H08-55920 | 2/1996 |
| JP | 2000-208434 | 7/2000 |
| JP | 2000-357736 | 12/2000 |
| JP | 2004-080033 | 3/2004 |
| JP | 2004-152784 | 5/2004 |
| JP | 2005-150333 | 6/2005 |
| JP | 2006-351861 | 1/2012 |
| KR | 10-1995-0034748 A | 12/1995 |
| KR | 10-0122315 B1 | 9/1997 |
| KR | 10-1999-0001440 | 1/1999 |
| KR | 10-1999-027887 | 4/1999 |
| KR | 10-2005-0052213 | 6/2005 |
| TW | 376582 | 12/1999 |
| WO | WO 94/15261 | 7/1994 |
| WO | WO 02/099864 A1 | 12/2002 |
| WO | WO 2004/001799 A2 | 12/2003 |
| WO | WO 2004/003977 | 1/2004 |
| WO | WO 2005/034215 A1 | 4/2005 |
| WO | WO 2006/026699 A2 | 3/2006 |

(56) References Cited

FOREIGN PATENT DOCUMENTS

OTHER PUBLICATIONS

Bhave et al. "Developer-Soluble Gap Fill Materials for Patterning Metal Trenches in Via-First Dual Damascene Process," Preprint of Proceedings of Spie: Advances in Resist Technology and Processing Xxi, vol. 5376, 2004, John L. Sturtevant, Editor, 8 Pages.

Bruek, "Optical and Interferometric Lithography—Nanotechnology Enablers," 2005, Proceedings of the IEEE, vol. 93, No. 10, pp. 1704-1721.

Cerofolini et al., "Strategies for Nanelectronics", *Microelectronic Engineering*, vol. 81, pp. 405-419.

Choi et al. "Sublithographic Nanofabrication Technology for Nanocatalysts and Dna Chips," *J.Vac. Sci. Technol.*, Nov./Dec. 2003; pp. 2951-2955.

Chung et al. "Nanoscale Multi-Line Patterning Using Sidewall Structure," Jpn., J. App.. Phys. vol. 41 (2002) Pt. 1, No. 6b, pp. 4410-4414.

Chung et al. "Pattern Multiplication Method and the Uniformity of Nanoscale Multiple Lines," J.Vac.Sci.Technol. B21(4), Jul./Aug. 2003, pp. 1491-1495.

U.S. Appl. No. 11/543,515, filed Oct. 24, 2006.

Ex parte Cantell, unpublished decision of the Board of Patent Appeals and Interferences, Mar. 4, 2005.

Final Office Action dated Mar. 29, 2010 in U.S. Appl. No. 11/669,840.

Joubert et al. "Nanometer Scale Linewidth Control During Etching of Polysilicon Gates in High-Density Plasmas," Microelectronic Engineering 69 (2003), pp. 350-357.

Oehrlein et al. "Pattern Transfer Into Low Dielectic Materials by High-Density Plasma Etching," Solid State Tech., May 2000, 8 Pages.

Office Action dated Jun. 2, 2008 in U.S. Appl. No. 11/219,067, filed Sep. 1, 2005.

Office Action dated Jun. 5, 2008 in U.S. Appl. No. 11/514,117, filed Aug. 30, 2006.

Office Action dated Jul. 11, 2008 in U.S. Appl. No. 11/367,020, filed Mar. 2, 2006.

Search Report dated Nov. 11, 2008 in ROC Taiwan Patent Application No. 097143566.

Sheats et al., "Microlithography: Science and Technology," 1998, Marcel Dekkar, Inc., pp. 104-105.

\* cited by examiner

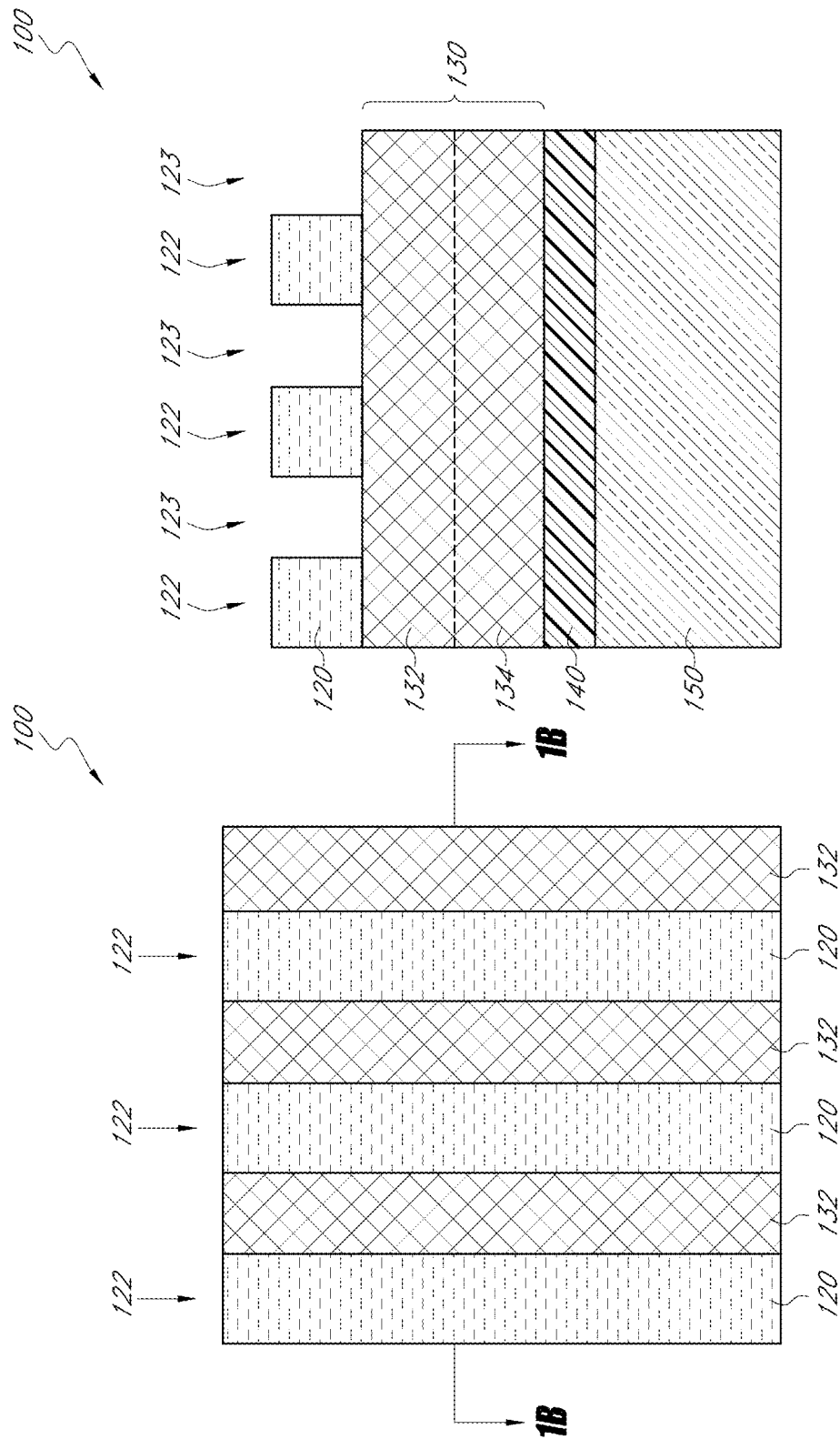

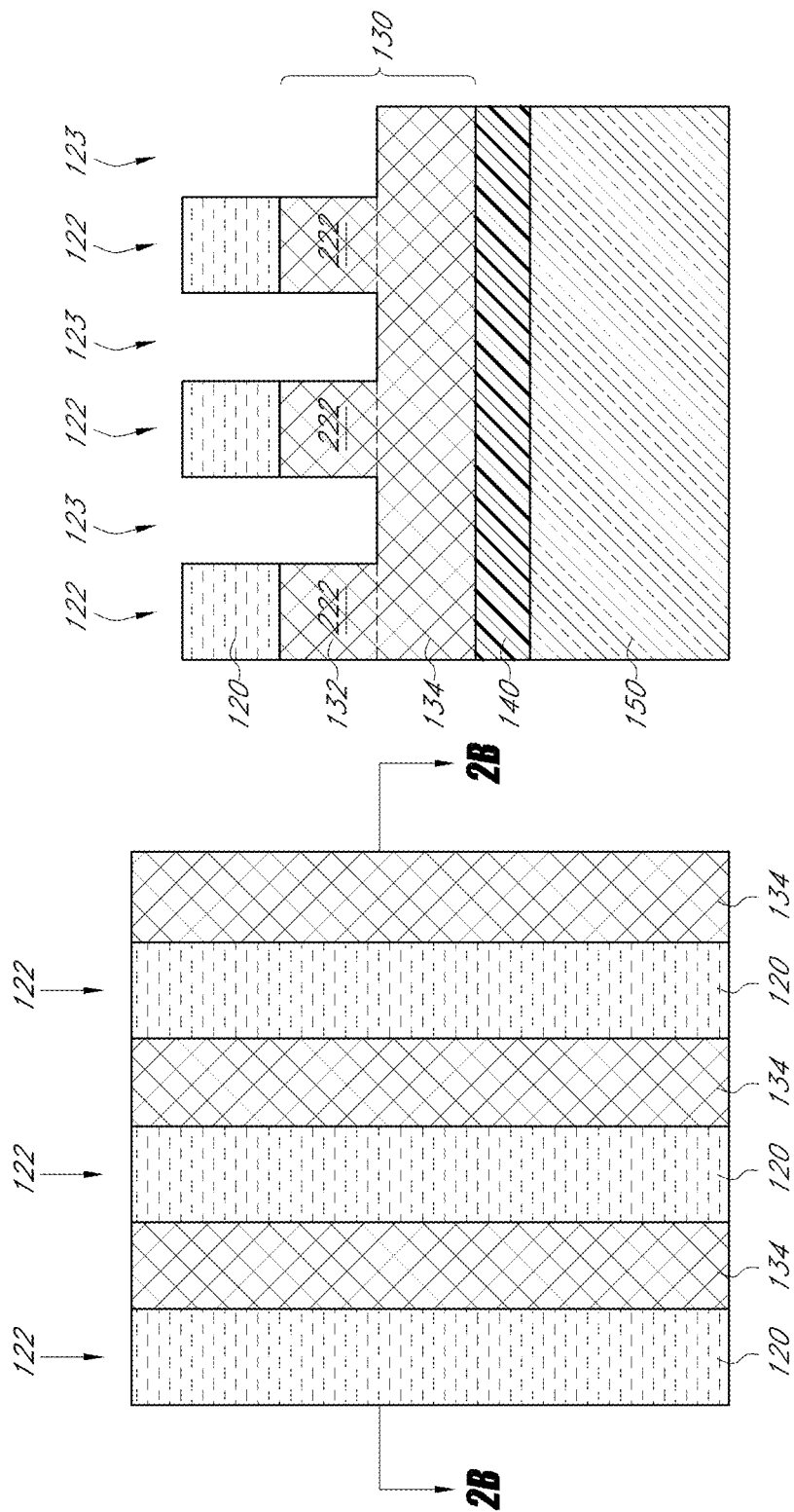

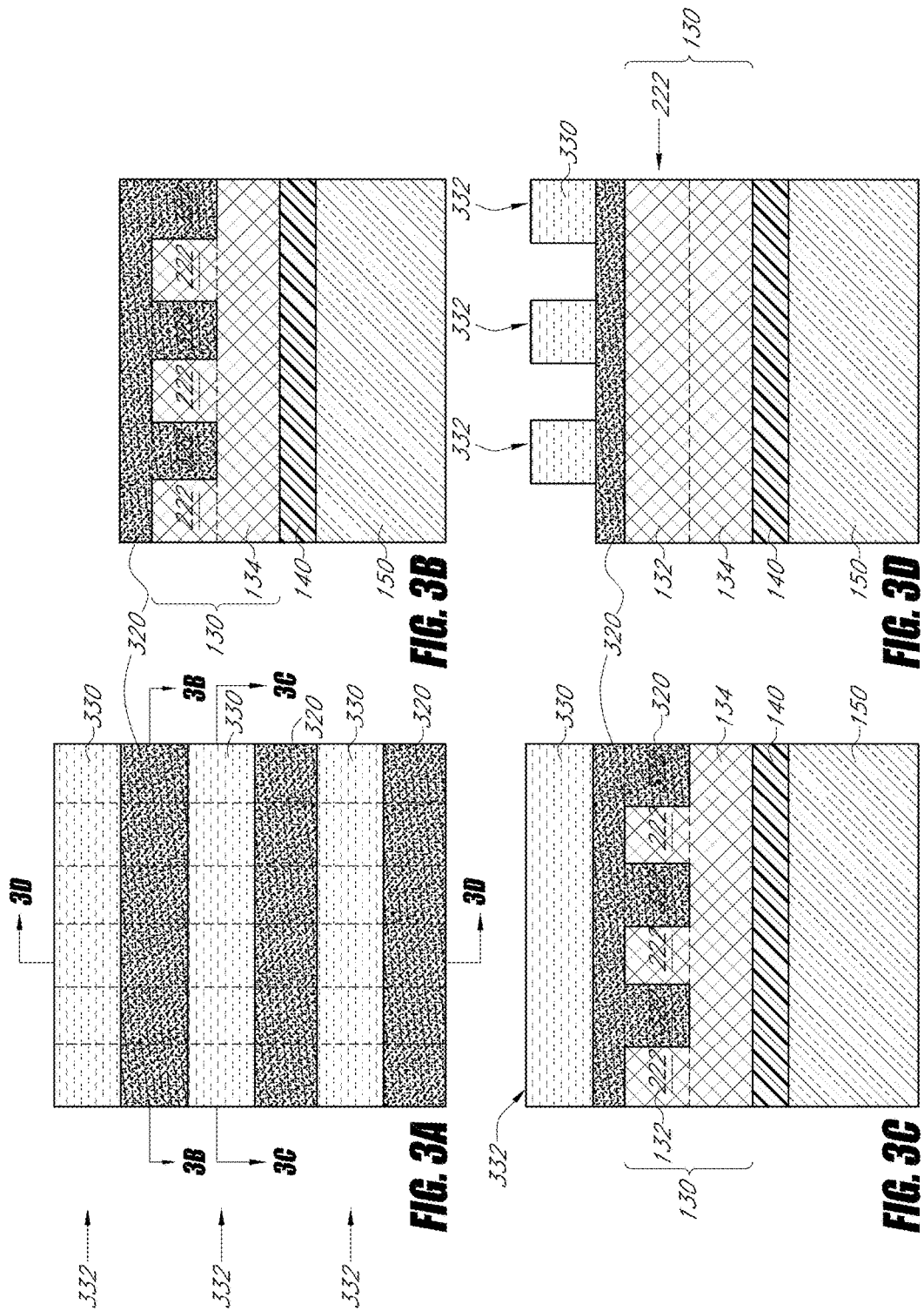

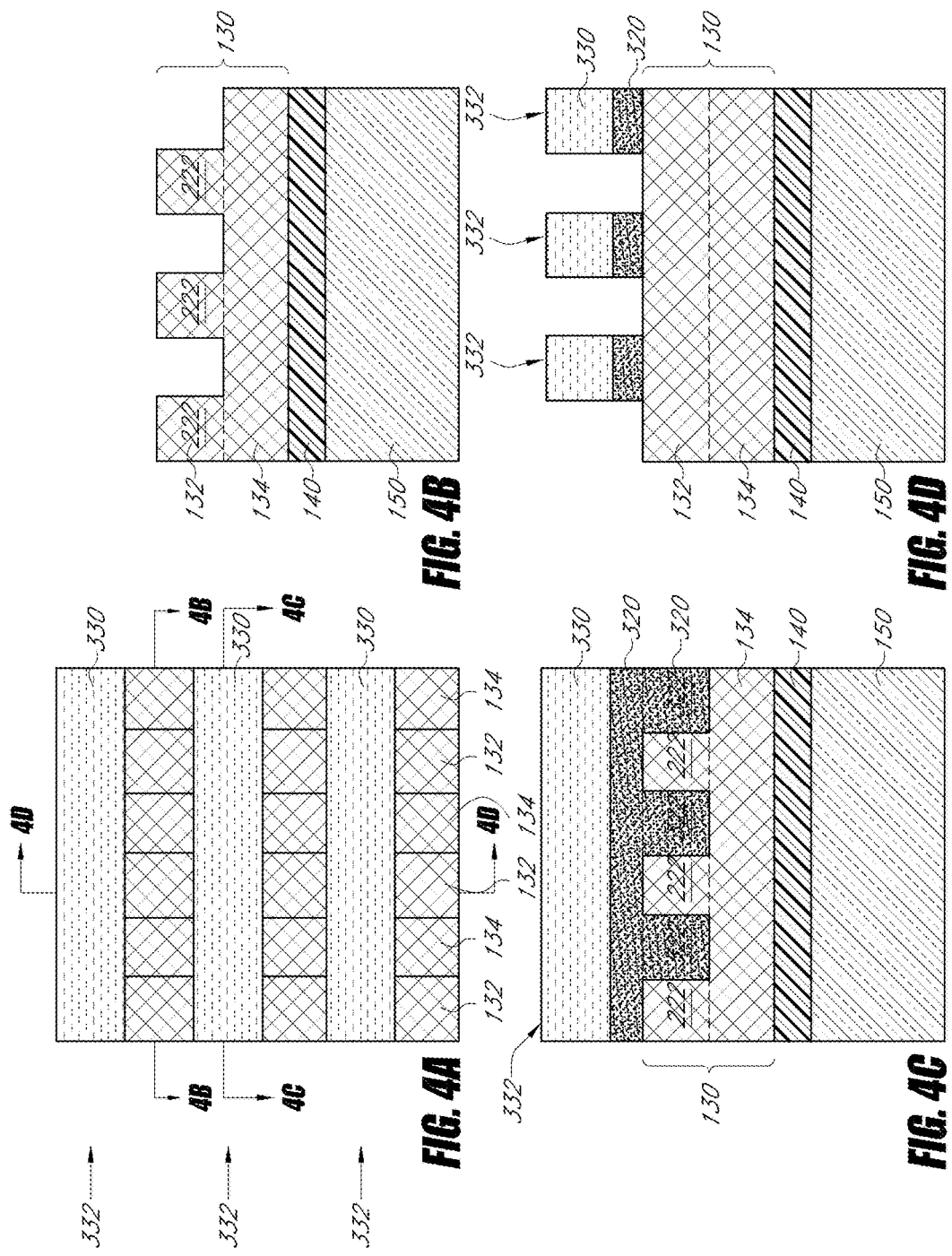

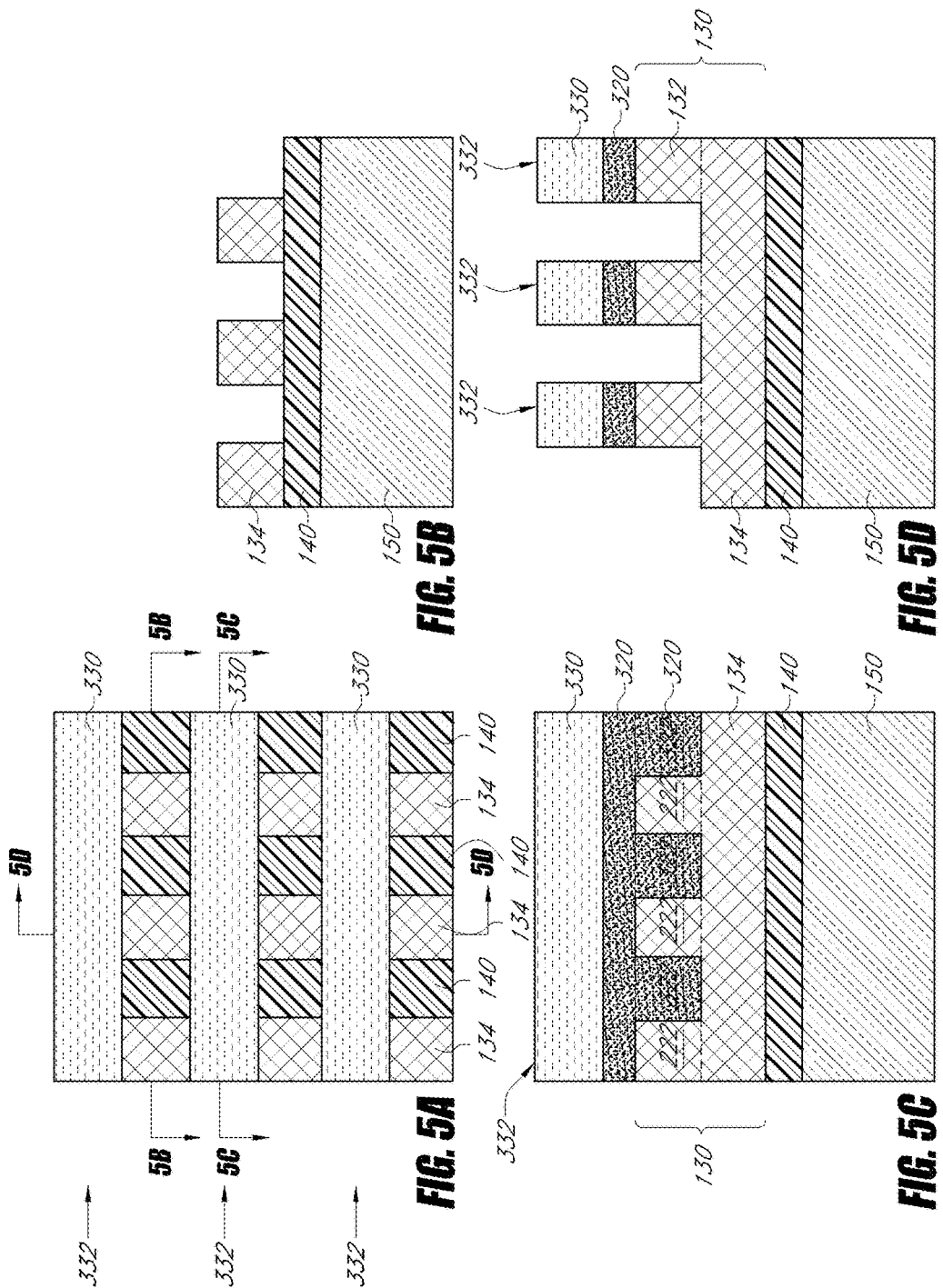

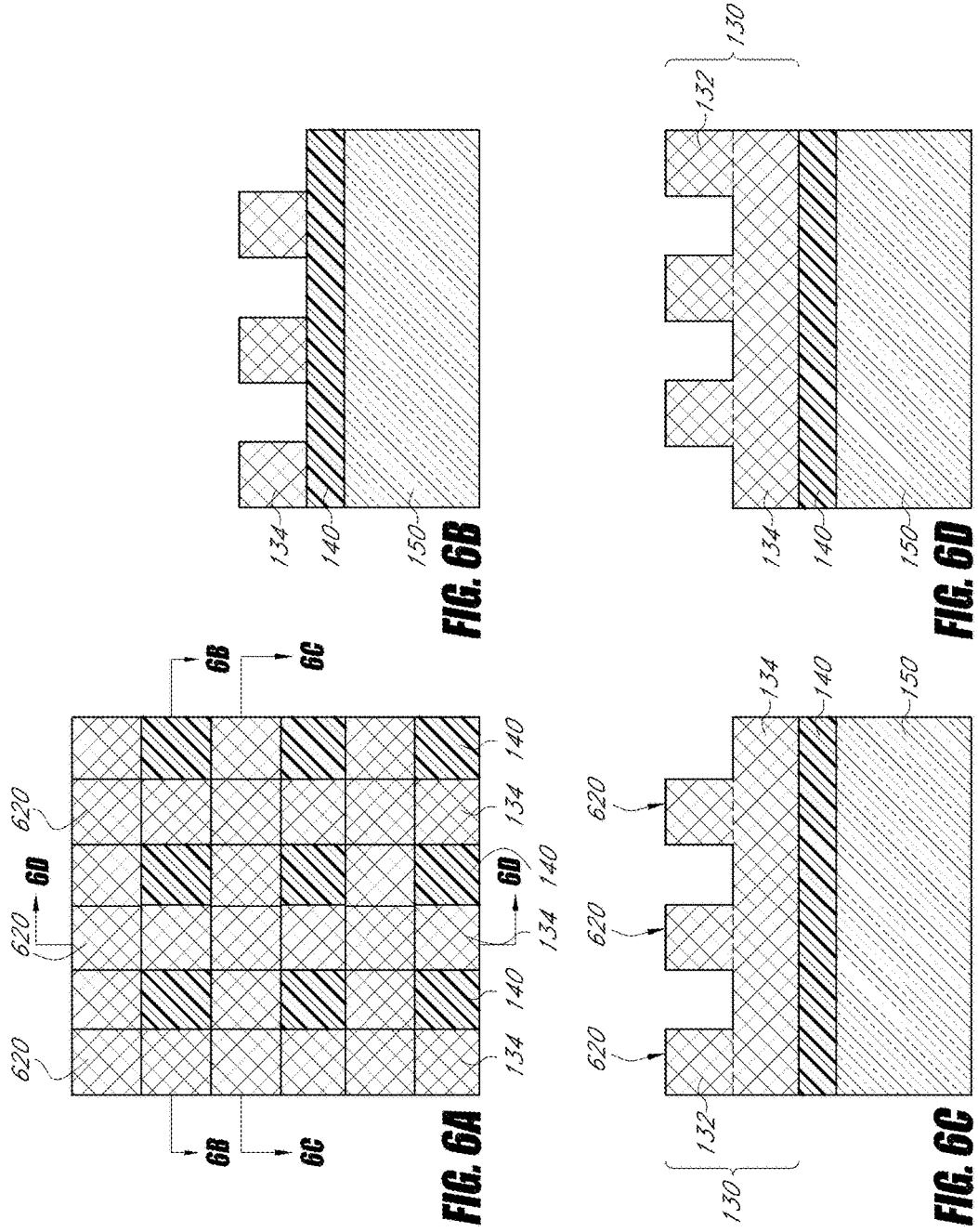

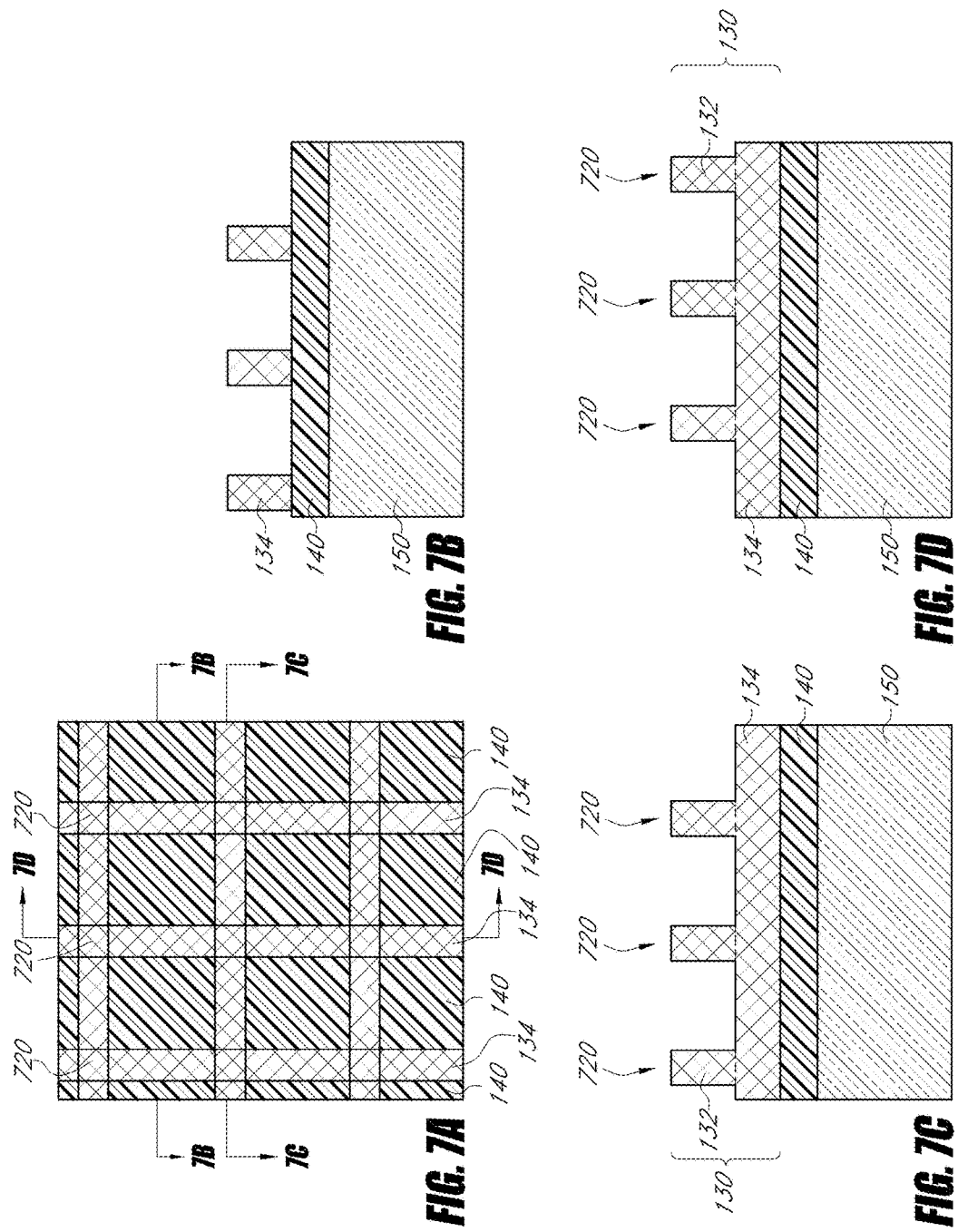

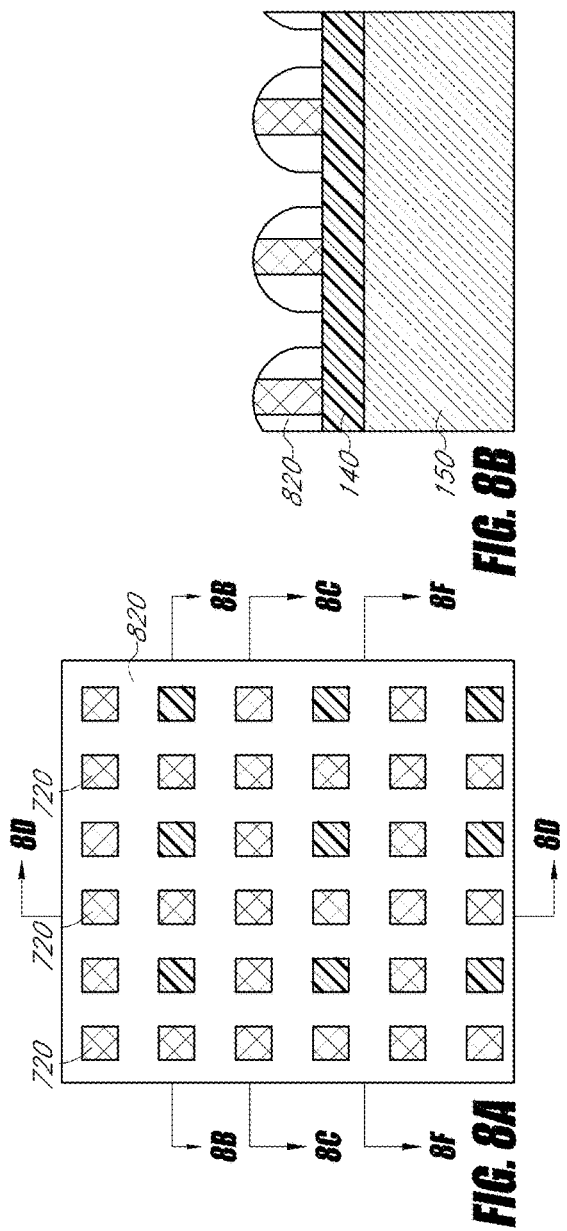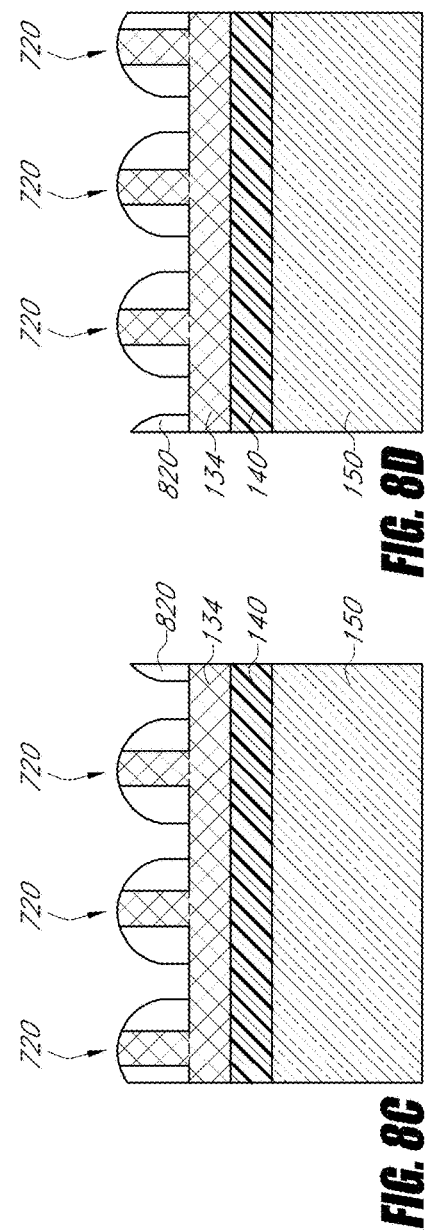

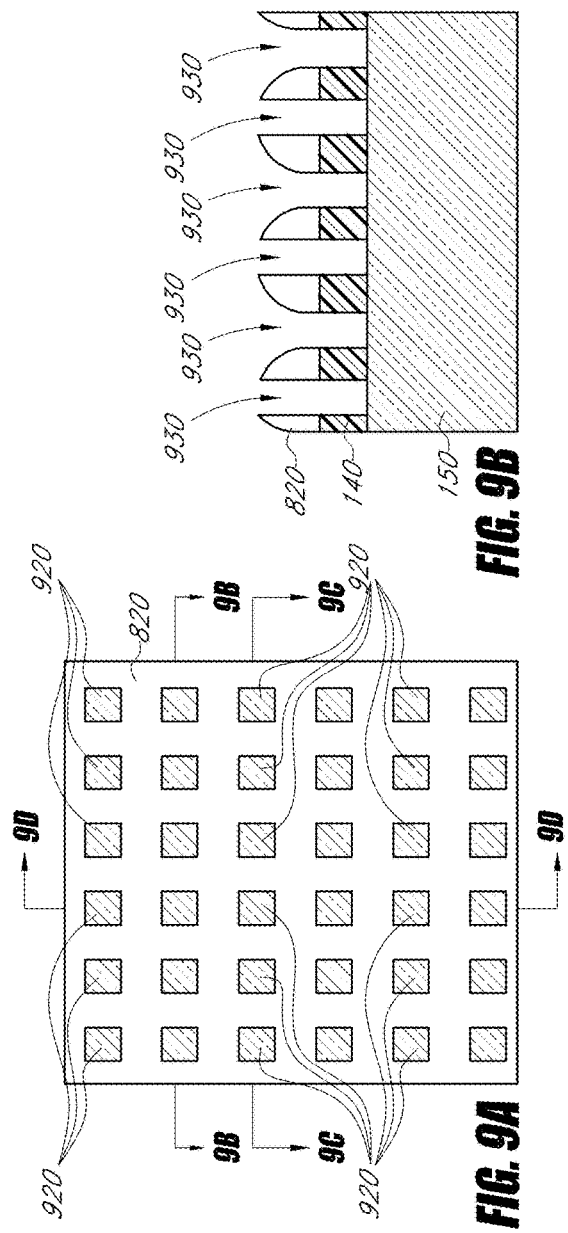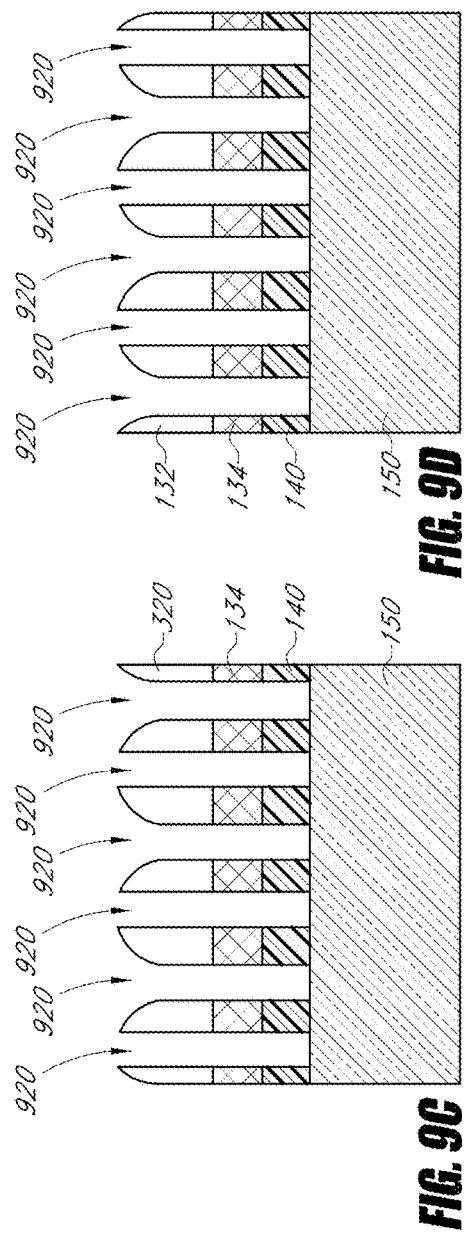

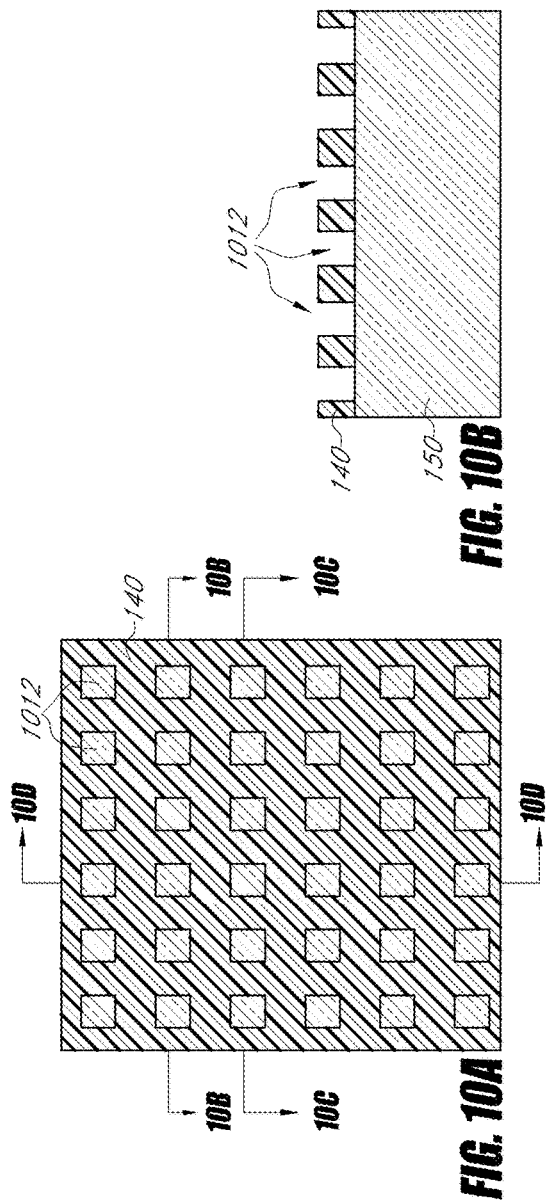

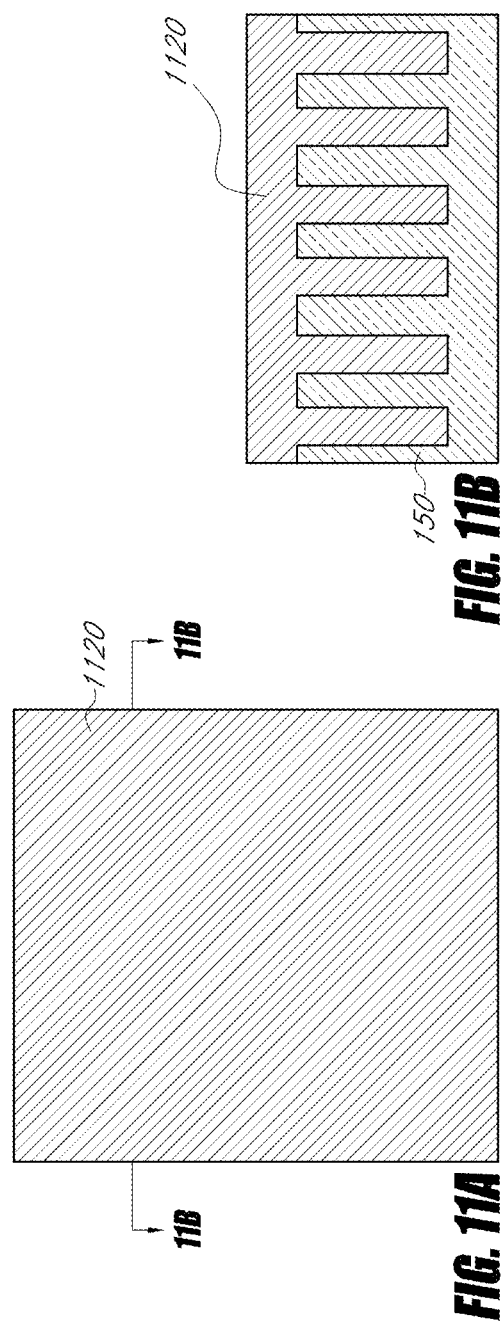

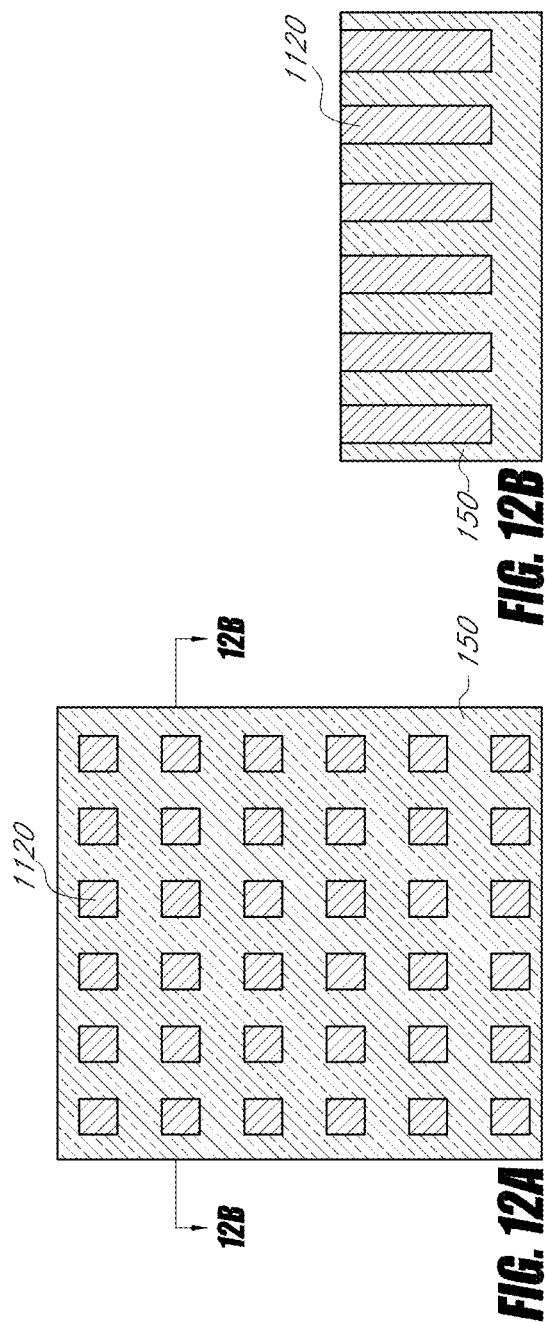

METHODS FOR FORMING ARRAYS OF SMALL, CLOSELY SPACED FEATURES

REFERENCE TO RELATED APPLICATIONS

This application is a continuation of U.S. patent application Ser. No. 14/094,482, filed: Dec. 2, 2013, which is a divisional of U.S. patent application Ser. No. 13/548,077, filed Jul. 12, 2012 (now U.S. Pat. No. 8,601,410, issued Dec. 3, 2013), which is a divisional of U.S. patent application Ser. No. 12/498,951, filed Jul. 7, 2009 (now U.S. Pat. No. 8,266,558, issued Sep. 11, 2012), which is a divisional of U.S. patent application Ser. No. 11/217,270, filed Sep. 1, 2005 (now U.S. Pat. No. 7,572,572, issued Aug. 11, 2009).

This application is related to the following: U.S. patent application Ser. No. 11/215,982 (MICRON.313A) filed Aug. 31, 2005; U.S. patent application Ser. No. 11/134,982 (MICRON.317A) filed May 23, 2005; and U.S. patent application Ser. No. 11/219,346 (MICRON.330A) filed Sep. 1, 2005. Each of the above-mentioned references is hereby incorporated by reference in its entirety and made part of this specification.

BACKGROUND OF THE INVENTIONS

Field of the Inventions

The disclosed invention relates generally to integrated circuit fabrication, techniques for fabrication of computer memory, and masking techniques.

Description of the Related Art

As a consequence of many factors, including demand for increased portability, computing power, memory capacity and energy efficiency in modern electronics, integrated circuits are continuously being reduced in size. To facilitate this size reduction, research continues into ways of reducing the sizes of integrated circuits' constituent features. Examples of those constituent features include capacitors, electrical contacts, interconnecting lines, and other electrical devices. The trend of decreasing feature size is evident, for example, in memory circuits or devices such as dynamic random access memories (DRAMs), static random access memories (SRAMs), ferroelectric (FE) memories, electronically-erasable programmable read-only memories (EEPROMs), flash memories, etc.

Computer memory typically comprises millions of identical circuit elements, known as memory cells, arranged in a plurality of arrays with associated logic circuitry. Each memory cell traditionally stores one bit of information, although multi-level cell devices can store more than one bit per cell. A conventional DRAM memory cell typically consists of two electrical devices: a storage capacitor and an access field effect transistor. Each memory cell is an addressable location that can store one bit (binary digit) of data. A bit can be written to a cell through the transistor and read by sensing charge on the storage electrode from the reference electrode side. One common type of computer memory that can benefit from higher density components is DRAM. By decreasing the sizes of constituent electrical devices, the conducting lines that connect them, and the conductive contacts carrying charge between them, the sizes of the memory devices incorporating these features can be decreased. Note that some memory arrangements can combine the storage and switch functions in a single device (e.g., dendritic memories using silver-doped chalcogenide glass elements) and others can omit the access device (e.g., magnetic RAM). Storage capacities and circuit speed can be increased by fitting more memory cells into the memory devices.

The concept of pitch can be used to describe the size of integrated circuit features. Pitch is the distance between identical points in two neighboring features. These features are typically defined by spaces between adjacent features, which spaces may be filled by a material, such as an insulator. As a result, pitch can be viewed as the sum of the width of a feature and of the width of the space separating that feature from a neighboring feature. When the pitch is reduced, features are more dense—that is, more features can fit onto the same surface. Although it may seem counterintuitive, the term "pitch reduction" is synonymous with "pitch multiplication" in common usage. That is, conventionally "multiplication" of pitch by a certain factor actually involves reducing the pitch by that factor. The term "pitch multiplication" emphasizes that more features can fit in the same area, while the term "pitch reduction" emphasizes that in order for more features to fit, those features are generally smaller. Pitch thus has at least two meanings: the linear spacing between identical features in a repeating pattern; and the density or number of features per linear distance. The conventional terminology is retained herein.

The demand for continual reduction in feature sizes places ever greater demands on techniques used to form the features. For example, photolithography is commonly used to pattern features on a substrate. Certain photoresist materials only respond to certain wavelengths of light. One common range of wavelengths that can be used lies in the ultraviolet (UV) range. Because many photoresist materials respond selectively to particular wavelengths, photolithography techniques each have a minimum pitch below which that particular photolithographic technique cannot reliably form features. This minimum pitch is often determined by the wavelength of light that can be used with that technique. Thus, the minimum pitch of a photolithographic technique can limit feature size reduction.

Pitch multiplication can extend the capabilities of photolithographic techniques to allow creation of more densely arranged features. Such a method is described in U.S. Pat. No. 5,328,810, issued to Lowrey et al., the entire disclosure of which is incorporated herein by reference and made part of this specification.

The critical dimension (CD) of a mask scheme or circuit design is the scheme's minimum feature dimension, or the measurement of the smallest width of the smallest feature that exists in that design or scheme. Due to factors such as geometric complexity and different requirements for critical dimensions in different parts of an integrated circuit, typically not all features of the integrated circuit will be pitch multiplied. Furthermore, pitch multiplication entails many additional steps relative to conventional lithography; the additional steps can involve considerable additional expense. Pitch multiplication often provides less control over the resulting features than that provided by direct patterning without pitch multiplication. Thus, pitch multiplication is typically thought useful for regularly spaced lines, such as conductive lines for a memory array. On the other hand, typical micromasking techniques, such as isotropic shrink steps, can result in a reduction in feature size but no corresponding increase in feature density. There have also been challenges in transferring very fine patterns to underlying layers because existing techniques do not adequately maintain resolution and fidelity through the transfer. There is a need for methods that can allow for smaller and more efficient operative units on an integrated circuit; such methods will advantageously increase feature density and decrease chip size.

Thus, there is a need for a reduction in the size of integrated circuits and an increased operable density of the arrays of electrical devices on computer chips.

SUMMARY OF THE INVENTIONS

Some embodiments provide a method of forming features in an array. For example, a first masking grid of crossing lines can be provided, the first masking grid corresponding to a first grid pattern. Furthermore, the pitch of the crossing lines of the masking grid can be simultaneously reduced to form a second masking grid of spacer lines, and the second masking grid can correspond to a second grid pattern.

Some embodiments provide a method of forming a feature array for an integrated circuit. For example, a first feature array can be formed in a first mask layer, a plurality of first features of the first feature array being elongate with a first axis of elongation. The first feature array can have a first pattern. A second feature array can be formed in a second mask layer, a plurality of second features of the second feature array having elongate features with a second axis of elongation that is not parallel to the first axis. The second feature array can have a second pattern. The first and second patterns can be consolidated into a combined third pattern, the third pattern corresponding to an arrangement of features in two vertical levels of the integrated circuit. Moreover, spacers can be simultaneously formed on sidewalls of both the first features and the second features.

Some embodiments provide a method of forming isolated features in an integrated circuit. For example, a substrate can be provided that is overlaid by multiple layers of masking material. A first series of selectively definable lines can be created in a first layer of masking material, the first series of lines corresponding to a first pattern. A second series of selectively definable lines can be created in a second layer of masking material, the second series of lines not parallel to the first series of selectively definable lines, the second series of lines corresponding to a second pattern. The pitch of both the first series and the second series of selectively definable lines can be concurrently reduced using a spacer material to create a grid of masking features having a smaller pitch than either the first or second series of selectively definable lines, the grid corresponding to a third pattern derived by superimposing the first and second patterns. The third pattern into the substrate can also be extended to form isolated features.

Some embodiments provide a method of forming features in an array. For example, a first masking grid of rows that cross columns can be provided, the first masking grid corresponding to a first grid pattern. A second masking grid of spacer lines can be formed by forming spacers or sidewalls of both the rows and columns, the second masking grid corresponding to a second grid pattern. A second grid pattern can be transferred to an underlying masking layer.

Some embodiments provide an array of features for computer memory fabrication. The array can have a middle tier comprising a grid with crossing lines, holes, and intersections, the lines having side walls. The array can also have a lower tier comprising a surface upon which the grid is positioned, the lower tier being exposed in the holes between the crossing grid lines. The array can also have a higher tier comprising pillars positioned on the grid where the grid lines cross at the intersections, the pillars having side walls.

Some embodiments have a hard mask comprising a non pitch-multiplied grid of masking material having crossing lines forming intersections and holes between intersections. The hard mask can also have pillars of masking material positioned on the grid at the intersections.

Some embodiments have a mask comprising a pitch-multiplied grid of masking material having pairs of crossing lines forming intersections. The mask can also have deep holes formed between line pairs where line pairs bridge over underlying structure and shallow holes formed between crossing line pairs where the line pairs do not bridge over any underlying structure.

Some embodiments provide a method of forming a hard mask. For example, a temporary layer can be provided and partially etched the temporary layer with a first pattern. The temporary layer can also be partially etched with a second pattern.

BRIEF DESCRIPTION OF THE DRAWINGS

The inventions will be further understood from the Detailed Description of the Preferred Embodiments and from the appended drawings, which illustrate and do not limit the inventions. The Figures show various masking, temporary, and substrate layers used in an integrated circuit. In particular:

FIG. 1A shows a schematic top plan view of a masking stack on a substrate, including a first definable layer (e.g., photoresist) having a pattern of lines. Section hatching is employed in the plan views to illustrate correspondence with cross sections.

FIG. 1B shows a schematic, cross-sectional side view taken along lines 1B-1B of FIG. 1A.

FIG. 2A shows a schematic plan view of the structure of FIG. 1A after a selective etch has partially extended the first line pattern into an underlying first temporary layer (e.g., a sacrificial hard mask formed from transparent carbon).

FIG. 2B shows a schematic, cross-sectional side view taken along lines 2B-2B of FIG. 2A.

In FIGS. 3A-10D, the A figure (e.g., FIG. 3A) shows a schematic plan view of the surface. The B figure (e.g., FIG. 3B) shows a schematic, cross-sectional side view taken along lines B-B (e.g., 3B-3B) of the A figure (e.g., FIG. 3A). The C figure (e.g., FIG. 3C) shows a schematic, cross-sectional side view taken along lines C-C (e.g., 3C-3C) of the A figure (e.g., FIG. 3A). The D figure (e.g., FIG. 3D) shows a schematic, cross-sectional side view taken along lines D-D (e.g., 3D-3D) of the A figure (e.g., FIG. 3A).

FIGS. 3A-3D show the structure of FIGS. 2A-2D after removal of the first definable layer, deposition of a planarized filler material (e.g., BARC), and formation of a second line pattern of a second definable material (e.g., photoresist), where the second lines are formed cross-wise to the first pattern of lines.

FIGS. 4A-4D show the structure of FIGS. 3A-3D after extension of the second line pattern into the filler material (e.g., using a BARC etch).

FIGS. 5A-5D show the structure of FIGS. 4A-4D after extension of the first line pattern into the lower portion of the temporary layer and extension of the second, crossing line pattern into the upper portion of the temporary layer (using a selective carbon etch, for example).

FIGS. 6A-6D show the structure of FIGS. 5A-5D after removal of remaining portions of the second definable layer and the filler material.

FIGS. 7A-7D show the structure of FIGS. 6A-6D after width reduction of the line structures of FIGS. 6A-6E (e.g., using an isotropic etch).

FIGS. 8A-8D show the structure of FIGS. 7A-7D after blanket deposition and subsequent etching of a spacer material (e.g., using a directional etch).

FIGS. 9A-9D show the structure of FIGS. 8A-8D after removal of remaining exposed portions of the first temporary layer and extension of the grid pattern in to a second temporary layer (e.g., DARC).

FIGS. 10A-10D show the structure of FIGS. 9A-9D after the remaining portions of the spacer material and remaining portions of the first temporary layer have been removed.

FIGS. 11A-11B show the structure of FIGS. 10A-10B after the second temporary layer has been filled with a filler material (e.g., conductive material).

FIGS. 12A-12B show the structure of FIGS. 11A-11B after overflow filler material has been etched back to form isolated contacts in the substrate.

DETAILED DESCRIPTION OF THE PREFERRED EMBODIMENT

Figure 6E:
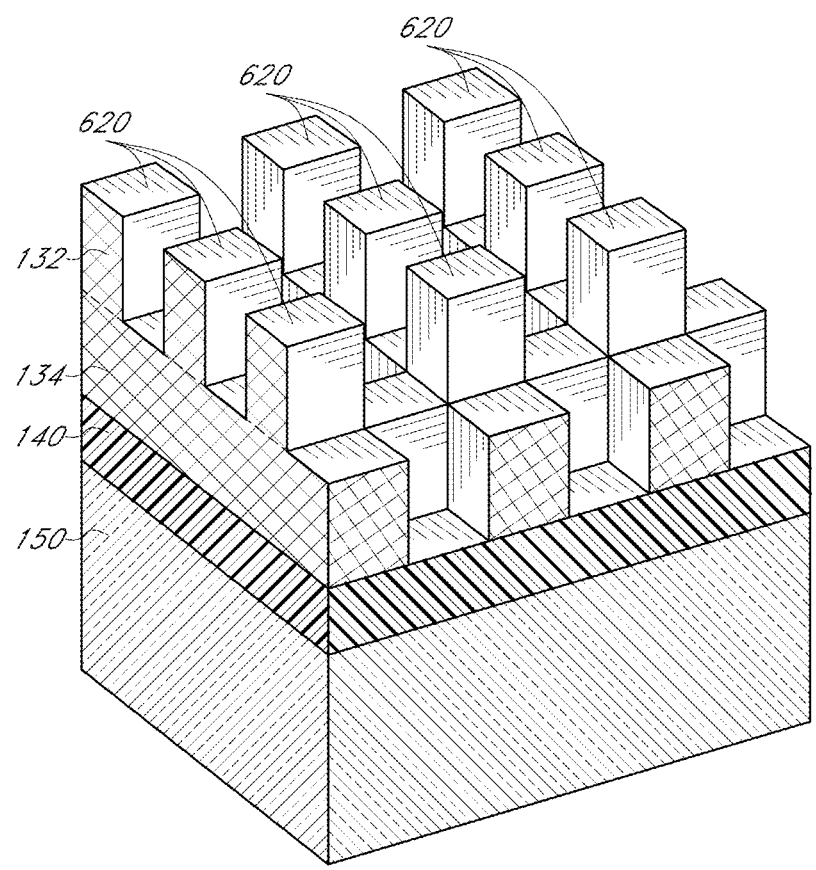
FIG. 6E shows a perspective view of the structure of FIGS. 6A-6D.

With reference to FIGS. 1A-1B, a partially formed integrated circuit 100 is provided. A substrate 150 is provided below various masking layers 120-140. The layers 120-140 can be etched to form masks for patterning underlying layers or the substrate 150. These masks can be used to form various features, as discussed below. The features can comprise, for example, portions of any of the following: transistors, diodes, resistors, capacitors, conductive lines, gates, sources, drains, programmable fuse elements, programmable conductor RAM (PCRAM) elements, such as silver-doped chalcogenide glass, or contacts to any of the above. In some embodiments, the features are formed from a substrate material that comprises a semi-conducting material. For example, the semi-conducting material can be silicon, silicon-germanium compounds, or III-V materials.

While the preferred embodiments can be used to form any integrated circuit, they are particularly advantageously applied to forming devices having arrays of electrical lines or devices, including memory cell arrays for volatile and non-volatile memory devices such as DRAM, phase change memory (PCM), programmable conductor RAM (PCRAM), ROM or flash memory, including NAND flash memory, or integrated circuits having logic or gate arrays. For example, the logic array can be a field programmable gate array (FPGA) having a core array similar to a memory array and a periphery with supporting logics. Consequently, the integrated circuit 100 can be, e.g., a memory chip or a processor, which can include both a logic array and embedded memory, or any other integrated circuit having a logic or a gate array.

The surfaces visible in FIG. 1A have been hatched for convenience to reveal the underlying materials of the structure depicted and to show which portions of the plan view correspond to structures depicted in cross-sectional views. Similar plan-view hatching is used throughout this description.

As used in this specification, the term "substrate" can refer not only to the substrate layer 150, but also to the entire subassembly, including previously formed layers and the underlying substrate or workpiece (e.g., silicon wafer). The term "substrate" can also encompass a layer or layers that have features or structures formed within them as a result of a semiconductor process (e.g., etching, doping, depositing, etc.) controlled by overlying masking layers.

As used in this specification, the term "pattern" can refer to an array or series of shapes that would be visible on a surface if viewed from above. A pattern can refer to the ensemble of shapes that correspond to a cross-section or shadow of features formed in one or multiple layers. The pattern is generally not the features themselves, but rather the layout or design corresponding to the sizes and arrangement of the features. A pattern can be defined by a combination of patterns derived from multiple overlying or side-by-side layers. A pattern can originate in one layer, such as a photodefinable layer, and then be transferred to another layer, such as a temporary layer or a hard mask layer. The pattern is said to be transferred to lower layers even if feature sizes and spacings are altered (e.g., by a feature shrink step). In contrast, a new pattern can be defined by pitch multiplication, whereby two or more features in the second pattern replace one feature of the first pattern.

A pattern in one layer can be derived from one or more patterns in another previous or overlying layer. A pattern can be said to be derived from another pattern even if the features in the resulting layer do not exactly resemble those features which gave rise to the original pattern, but rather the underlying pattern generally follows the outline of the overlying pattern with minor deviations in dimensions. The term "to pattern" can also be used as a verb and means to create or form a pattern.

An array is a collection of electrical components or features, formed in a repeating configuration, that can span multiple layers of an integrated circuit. As described above, multiple cells can form a memory array for a DRAM or NAND flash memory circuit, for example, or a logic array. An arrangement of features formed in a particular layer can have a corresponding pattern. An array can similarly have a corresponding pattern.

The materials for the substrate 150 and the layers 120-140 overlying the substrate 150 are preferably chosen based upon consideration of the chemistry and process conditions for the various pattern forming and pattern transferring steps discussed herein. Because the layers between a topmost selectively definable layer 120—which preferably is definable by a lithographic process-and the substrate 150 will preferably function to transfer a pattern derived (at least in part) from the selectively definable layer 120 to the substrate 150, the layers between the selectively definable layer 120 and the substrate 150 are preferably chosen so that they can be selectively etched relative to other exposed materials. A material is considered selectively, or preferentially, etched when the etch rate for that material is at least about five times greater, preferably about ten times greater and, most preferably, at least about forty times greater than that for surrounding materials.

In common methods of transferring patterns, both the mask and the underlying substrate are exposed to an etchant, which preferentially etches away the substrate material. The etchants, however, can also wear away the mask materials, albeit at a slower rate. Thus, over the course of transferring a pattern, the mask can be worn away by the etchant before the pattern transfer is complete. These difficulties are exacerbated where the substrate 150 comprises multiple different materials to be etched. In such cases, additional mask layers may be used to prevent the mask pattern from being worn away before the pattern transfer is complete.

Because the various layers are chosen based upon the requirements of chemistry and process conditions, one or more of the layers can be omitted in some embodiments. In some embodiments, hard mask layers may play a protective role, protecting underlying layers from unwanted degradation during etching of overlying layers. Similarly, for a particularly simple substrate, various other layers may be omitted and overlying mask layers may be sufficient for the desired pattern transfer. Higher numbers of mask layers are advantageous for transferring patterns to difficult to etch substrates, such as a substrate comprising multiple materials or multiple layers of materials, or for forming small and high aspect ratio features.

First Phase

In a first phase of methods in accordance with the preferred embodiments and with reference to FIGS. 1A-6E, crossing striped patterns are formed, each having a pitch definable by photolithography, and consolidated into a grid pattern in a single layer. One example of a process sequence for this phase is the following: 1) deposition of multiple layers; 2) photolithographic patterning of a first photosensitive layer; 3) extension of the first pattern into underlying layers; 4) blanket deposition of a filler material; 5) formation and photolithographic patterning of a second photosensitive layer; and 6) extension of the second pattern into the same underlying layers having the first pattern.

Another example of a process sequence for the first phase is the following: 1) deposition of multiple layers; 2) photolithographic patterning of a first photosensitive layer; 3) shrinking the features in the first pattern; 4) extension of the first pattern into underlying layers; 5) blanket deposition of a filler material; 6) formation and photolithographic patterning of a second photosensitive layer; 7) shrinking the features of the second pattern; and 8) extension of the second pattern into the same underlying layer(s) having the first pattern.

As discussed herein, masks with different patterns at distinct levels can both shield the underlying layers or substrate. FIGS. 6A-6E, for example, show how two patterns can operate together or be consolidated to effectively form a combined pattern or mask from two superimposed, crossing patterns. (Similarly, masks with different patterns at distinct layers can both shield the underlying layers or substrate).

For convenience in this application, the term "level" is used to designate a portion of the integrated circuit that is generally located in a plane that is parallel to and equidistant from the plane of the surface of the substrate 150. In contrast, the term "layer" is generally used to refer to a portion of the integrated circuit formed from the same material and deposited in a single step.

FIG. 1A shows a schematic plan view of a first line pattern having lines 122 that have been patterned photolithographically in a first definable layer 120. The first line pattern can be referred to as "vertical" or as "columns" herein because of the appearance of the lines 122 in the plan view of FIG. 1A. In the figures, the same orientation is depicted consistently for FIGS. 1A, 2A, 3A, and so forth for all the figures labeled "A." The same is true for the "B," "C," and "D" figures.

FIG. 1B shows a cross section through the structure of FIG. 1A. Underlying the first definable layer 120 is a first temporary layer 130 with an upper portion 132 and a lower portion 134. The upper portion 132 is visible in FIG. 1A between the lines 122 formed in the first definable layer 120. The first temporary layer 130 serves as a sacrificial hard mask. In some embodiments, the upper portion 132 and lower portion 134 can be formed from different materials and form separate layers. Amorphous carbon and particularly transparent carbon is a preferred material for the first temporary layer 130 because so many other materials—silicon, silicon oxide, silicon nitride, etc.—can be selectively etched without significantly harming the carbon layer and because carbon is relatively resistant to high temperatures processing, compared to resists. Underlying the lower portion 134 of the first temporary layer 130 is a second temporary layer 140. The second temporary layer 140 can be formed from a dielectric anti-reflective coating, or DARC. Underlying the second temporary layer 140 is a substrate 150, which can be a silicon wafer, for example.

The definable layer 120 can be formed from photoresist. For example, the photoresist can be any photoresist compatible with 13.7 nanometer (nm), 157 nm, 193 nm, 248 nm or 365 nm wavelength systems, 193 nm wavelength immersion systems or electron beam lithographic systems. Examples of preferred photoresist materials include argon fluoride (ArF) sensitive photoresist, e.g., photoresist suitable for use with an ArF light source, and krypton fluoride (KrF) sensitive photoresist, e.g., photoresist suitable for use with a KrF light source. ArF photoresists are preferably used with photolithography systems utilizing relatively short wavelength light, e.g., 193 nm. KrF photoresists are preferably used with longer wavelength photolithography systems, such as 248 nm systems. In other embodiments, the definable layer 120 and any subsequent resist layers can be formed of a resist that can be patterned by nano-imprint lithography, e.g., by using a mold or mechanical force to pattern the resist.

Photoresist is typically patterned by being exposed to radiation through a reticle and then developed. In the case of negative photoresist, radiation, e.g., light, is focused on parts of the photoresist that are to be retained, e.g., on the areas where the lines—such as lines 124 (see FIG. 3)—are to be formed. Typically, the radiation activates a photosensitive compound, e.g., a photo-induced acid generator (PAG), which decreases the solubility of the photoresist, e.g., by causing it to polymerize. Preferred embodiments may be applied using any definable material, including positive or negative photoresist. Some preferred photoresist reticles have a critical dimension of approximately 95 nm.

The first temporary layer 130 can be formed of amorphous carbon, which offers very high etch selectivity relative to the other preferred hard mask materials. More preferably, the amorphous carbon is a form of transparent carbon that is highly transparent to light and which offers further improvements for photo alignment by being transparent to wavelengths of light used for such alignment. Deposition techniques for forming a highly transparent carbon can be found in A. Helmbold, D. Meissner, *Thin Solid Films*, 283 (1996) 196-203, the entire disclosure of which is incorporated herein by reference and made part of this specification.

The material for the second temporary layer 140 preferably comprises an inorganic material, and exemplary materials include silicon dioxide ($SiO_2$), silicon, or a dielectric anti-reflective coating (DARC), such as a silicon-rich silicon oxynitride. In the illustrated embodiment, the second temporary layer 140 is a dielectric anti-reflective coating (DARC). Thus, the second temporary layer 140 can serve both as an intermediate hard mask and to reduce reflections during lithography. Using DARC material for the second temporary layer 140 can be particularly advantageous for forming patterns having pitches near the resolution limits of a photolithographic technique. The DARC can enhance resolution by minimizing light reflections, thus increasing the precision with which photolithography can define the edges of a pattern.

The substrate 150 can include a silicon wafer used for formation of integrated circuits with or without overlying materials. Various substrate materials can be used.

In addition to selecting appropriate materials for the various layers, the thicknesses of the layers 120-140 are preferably chosen depending upon compatibility with the etch chemistries and process conditions described herein. For example, when transferring a pattern from an overlying layer to an underlying layer by selectively etching the underlying layer, materials from both layers are removed to some degree. Thus, in some embodiments, the upper layer is preferably thick enough so that it is not worn away over the course of the pattern transfer. Thin hard mask layers can allow their transfer or removal to occur quickly, exposing surrounding materials to less wear.

In the illustrated embodiment, the selectively definable layer 120 (e.g., photoresist) is a photodefinable layer preferably between about 100-500 nm thick and, more preferably, between about 150-280 nm thick. The first temporary layer 130 (e.g., amorphous carbon) is preferably between about 100-500 nm thick and, more preferably, between about 150-300 nm thick. The second temporary layer 140 (e.g., DARC) is preferably between about 15-120 nm thick and, more preferably, between about 30-60 nm thick.

The various layers discussed herein can be formed by various methods known to those of skill in the art. For example, various vapor deposition processes, such as chemical vapor deposition, can be used to form the various hard mask layers under the resist. Preferably, a low temperature chemical vapor deposition process is used to deposit the hard mask layers or any other materials, e.g., spacer material, over carbon. Such low temperature deposition processes advantageously prevent chemical or physical disruption of the underlying amorphous carbon layer. Spin-on-coating processes can be used to form photodefinable layers. In addition, amorphous carbon layers can be formed by chemical vapor deposition using a hydrocarbon compound, or a mixture of such compounds, as a carbon precursor. Exemplary precursors include propylene, propyne, propane, butane, butylene, butadiene and acetylene. A suitable method for forming amorphous carbon layers is described in U.S. Pat. No. 6,573,030 B1, issued to Fairbairn et al. on Jun. 3, 2003, the entire disclosure of which is incorporated herein by reference and made part of this specification. In addition, the amorphous carbon may be doped. A suitable method for forming doped amorphous carbon is described in U.S. patent application Ser. No. 10/652,174 to Yin et al., the entire disclosure of which is incorporated herein by reference and made part of this specification.

With further reference to FIG. 1B, a pattern comprising gaps or spaces 123 delimited by the lines 122 is formed in the definable layer 120. The lines 122 and spaces 123 can be formed by, e.g., photolithography, in which the selectively definable layer 120 is exposed to radiation through a reticle and then developed. After being developed, the remaining definable material, photoresist in the illustrated embodiment, forms mask features such as the illustrated lines 122 (shown in cross-section). In some embodiments, the widths of the features (e.g., lines 122) of the mask are in a range of approximately 50-200 nm.

The pitch of the first line pattern of FIGS. 1A-1B is equal to the sum of the width of a line 122 and the width of a neighboring space 123. To minimize the critical dimensions of features formed using this pattern of lines 122 and spaces 123, the pitch is preferably at or near the limits of the photolithographic technique used to pattern the definable layer 120. For example, for photolithography utilizing 248 nm light, the pitch of the lines 122 can be about 200 nm. Thus, the pitch may be at the minimum pitch of the photolithographic technique and the spacer pattern discussed below can advantageously have a pitch below the minimum pitch of the photolithographic technique.

As illustrated by FIGS. 1A-1B, a preliminary step can comprise creating a series of photoresist lines 122. Thus, photolithography can be used to form a plurality of lines in a mask material. Conventional photolithography can form lines having a pitch no smaller than that definable by photons. However, subsequent pitch multiplication can form lines having a pitch that is smaller than that definable by conventional photolithography. Often the features of a pattern are prepared for pitch multiplication by a shrink step that reduces the widths of the protruding, positive features (such as lines or columns or blocks) and increases the widths of negative features (such as trenches or spaces or holes or voids). The shrink step can leave provide more room in between positive features for a spacer material to be deposited on and extend outwardly from the sidewalls of the positive features.

Although not illustrated in FIGS. 1A and 1B, the photoresist lines 122 can undergo a shrink step after they are originally patterned. For example, an isotropic etch can reduce the widths of the lines 122 and increase the widths of the spaces 123. An $SO_2$ plasma-based vapor etch is an exemplary trim etch for photoresist. If a shrink step occurs at this stage before the first pattern is transferred into the first temporary layer 130, a later shrink step (see FIGS. 7A-7D) can be avoided or improved.

FIGS. 2A-2B show the structure of FIGS. 1A-1B after a selective etch (e.g., a carbon etch) has extended or transferred the first line pattern into the underlying upper portion 132 of the first temporary layer 130 to form lines 222. In some embodiments, the first temporary layer 130 is monolithic and the upper portion 132 is indistinguishable from the lower portion 134 before the selective etch. Thus, the selective etch defines the relative thicknesses of the upper portion 132 and the lower portion 134. In some embodiments, the selective etch extends partially into (e.g., about halfway down into) the temporary layer 130. FIG. 2A shows a schematic plan view of the surface. FIG. 2B shows a schematic, cross-sectional side view taken along lines 2B-2B of FIG. 2A. This pattern extension or transfer can be accomplished by selectively etching the material that forms the first temporary layer 130, while the lines 122 form a protective mask that prevents the etchant from removing the material located underneath the lines 122.

In some embodiments, an additional layer (not shown) can be applied above the temporary layer 130. The additional layer can be formed from DARC, for example, and can have sufficient thickness to have an upper portion and a lower portion, similar to the upper portion 132 and the lower portion 134 of the temporary layer 130. In this case, the partial etch and other description herein relating to the temporary layer 130 can apply to the overlying layer, and the structure and/or pattern thus created in the overlying layer can be transferred into the temporary layer 130, which can be formed from carbon, for example.

In the illustrated embodiment, a pattern is formed in an overlying layer and later transferred to an underlying layer. In FIG. 2B, the illustrated walls of the features formed in layers 120 and 130 are vertical, where these layers have been etched. In order to achieve vertical sidewalls in this step and in other steps described herein, directional or anisotropic etches can be used.

Variations in etching processes can alter the precision with which a pattern in an overlying layer corresponds to a pattern created in an underlying layer. Although pattern transfer from layer to layer is generally illustrated schematically to be a precise process, with features having vertical side walls, such precision may be difficult to achieve in practice. Thus, pattern transfer is intended to encompass general correspondence between underlying and overlying patterns. Similarly, pattern transfer is meant to encompass modification of the features originally defining the pattern—for example by enlarging or shrinking those features—where such modification does not change the pitch.

To transfer the first line pattern into the upper portion 132 of the first temporary layer 130, an $SO_2$-containing plasma, e.g., a plasma containing $SO_2$, $O_2$ and Ar, is preferably used. Advantageously, the $SO_2$-containing plasma can etch carbon of the preferred first temporary layer 130 at a rate greater than 20 times and, more preferably, greater than 40 times the rate that the definable layer 120 is etched. A suitable $SO_2$-containing plasma is described in U.S. patent application Ser. No. 10/931,772 to Abatchev et al., filed Aug. 31, 2004, entitled Critical Dimension Control, (Micron Ref. No. 2003-1348), the entire disclosure of which is incorporated herein by reference and made part of this specification. Although FIGS. 2A-2B show lines 122 intact after the pattern has been extended into the first temporary layer 130, the $SO_2$-containing plasma can simultaneously etch the temporary layer 130 and also remove the remaining portion of definable layer 120.

FIGS. 3A-3D show the structure of FIGS. 2A-2B after any remaining portions of the first definable layer 120 are removed by a selective etch. One etch that can be used has a selectivity of approximately 8:1, and has the following low pressure recipe: $O_2$ flows at approximately 400 sccm, $N_2H_2$ flows at approximately 400 sccm, $CF_4$ flows at approximately 40 sccm, the temperatures is approximately 150 degrees C., the pressure is approximately 150 mT, and the applied power is approximately 2000 W.

A filler material 320 (e.g., a bottom anti-reflective coating, or BARC material) has also been deposited between the lines 222 of the first temporary layer 132 to form alternating lines 322 of filler material 320 in between the lines 222 in the upper portion 132 of the first temporary layer 130. The filler material 320 has also been deposited over the top of the alternating stripes formed by the lines 222 and the lines 322, but the borders between the hidden, underlying lines 222 and 322 are shown in phantom in FIG. 3A. The filler material 320 (e.g., BARC) can be deposited using a spin-on process to provide for a smooth, self-planarizing layer. Alternatively, the filler material 320 can be deposited by a more conformal process followed by planarization (e.g., a dry etch back or polishing process). A second selectively definable layer 330 (formed, for example, from photoresist) has been deposited over the filler material 320 and patterned to form a second (horizontal or row) line pattern having lines 332 that are not parallel to the lines 122 of the first line pattern. In FIG. 3A, the underlying first vertical line pattern is perpendicular to the overlying second horizontal line pattern.

Although not illustrated in FIGS. 3A-3D, the selectively defined lines 332 can undergo a shrink step after they are originally patterned. For example, an isotropic etch can reduce the widths of the lines 332 and increase the widths of the spaces in between the lines 332 (e.g., $SO_2$ plasma based etch without bias). This shrink step can be substantially similar to the alternative described (but not illustrated) above with respect to the lines 122. If the first lines 122 and the second lines 332 are both shrunk (or reduced in width) before each respective line pattern is transferred to underlying layers, a later shrink step (see FIGS. 7A-7D) can be avoided and the resulting grid pattern can have good resolution and sharp corners where lines intersect. For example, the holes and pillars can have sidewalls that are more angular where sidewalls intersect, creating square rather than rounded holes and corners. (See FIGS. 6A-7E for schematic illustrations of holes and pillars).

FIGS. 4A-4D show the structure of FIGS. 3A-3D after exposed portions of the filler layer 320 have been removed (using a selective BARC etch, for example). The lines 332 of the second definable layer 330 form a protective mask that shields some portions (rows in the illustrated embodiment) of the filler material 320 such that the second line pattern has been extended into the filler material 320.

FIGS. 5A-5D show the structure of FIGS. 4A-4D after the exposed portions of the first temporary layer 130 have been partially removed (using a selective carbon etch, for the preferred temporary layer material), extending the first line pattern into the lower portion 134 of the first temporary layer 130, and extending the second, crossing line pattern into the upper portion 132 of the temporary layer 130. Preferably, the extent of the etch that extends the second, crossing line pattern into the upper portion 132 of the temporary layer 130 can be controlled or timed, allowing the etch to penetrate part-way (e.g., half-way) through the temporary layer 130. An underlying second temporary layer 140 (formed from a dielectric anti-reflective coating, or DARC, for example) has been partially exposed in the areas unmasked by either the first or second line patterns. In some embodiments, both the temporary layer 130 and the filler material 320 can be etched by the same etch process (e.g., if both layers contain carbon).

FIGS. 6A-6D show the structure of FIGS. 5A-5D after any remaining portions of the second definable layer 330 and the remaining portions of the filler material 320 have been removed, leaving exposed a three-tiered structure. This can be accomplished in the same etch process described above (e.g., carbon etch) if the definable layer 120 and the filler material 320 are both organic materials. For example, a dry develop step or an $SO_2$ or $O_2$-containing plasma can be used. The lowest of the three exposed tiers comprises those parts of the second temporary layer 140 masked by neither the first (horizontal) nor the second (vertical) line patterns. The middle exposed tier comprises exposed segments of the lower portion 134 of the first temporary layer 130. The highest of the three exposed tiers comprises exposed segments of the upper portion 132 of the first temporary layer 130. The highest of the three exposed tiers comprises the top surfaces of pillars 620.

FIG. 6E shows a perspective view of the structure illustrated in FIGS. 6A-6D. The three-tiered structure is visible. The top (exposed) surface of the second temporary layer 140 is the lower tier, representing twice-etched regions of the first temporary layer 130. The generally square portions of the temporary layer 140 that are exposed in this figure are located in a generally vertical column of materials that has been subjected to multiple etch processes (two in the illustrated embodiment) without being protected by a mask. That is, the lower tier portions have not been protected from the carbon etches by either the first or second line patterns. Thus, the generally vertical column of materials has been etched away through multiple etches until in the illustrated stage, nothing remains of that vertical column of materials above the exposed lower tier portions of the second temporary layer 140.

Top surfaces of the lower portion 134 of the temporary layer 130 form the middle tier. As shown, what remains of the lower portion 134 of the temporary layer 130 forms a grid that overlies the second temporary layer 140. Both the first (vertical or column) and second (horizontal or row) line patterns have been consolidated into the grid. The middle tier portions have been protected by one of the first and second line patterns, but not by both.

The top surfaces of the upper portion 132 of the temporary layer 132, the tops of the pillars 620, form the higher tier. What remains of the upper portion 132 of the first temporary layer 130 forms pillars 620 positioned on top of the grid at the intersection of the vertical and horizontal grid lines. The pillars 620 have been protected from multiple etches because both the first and second (crossing) line patterns have protected the pillars 620.

FIGS. 6A-6E schematically depict various features, including pillars 620, a grid pattern, and holes in the grid pattern. These features are depicted as having relatively sharp corners; the pillars and grid holes have side walls that are generally flat, and intersect at right angels. In practice these corners may be somewhat more rounded due to the properties of the materials used, the chemistries employed to achieve the structure, etc. However, one way to provide for sharper corners on these features is to perform a shrink step on (reduce the width of) each of the first lines 122 and second lines 332 before those line patterns are transferred to underlying layers.

As described above, the temporary layer 130 may have another temporary layer (not shown) above it. The other temporary layer can have the two-tier structure depicted in FIGS. 6A-6E, and the two-tier structure can then be transferred into the temporary layer 130. The two-tier structure created in the overlying layer can be created in the same way described here for the temporary layer 130. For example, the overlying temporary layer can be formed from DARC, and the temporary layer 130 can be formed from carbon. The two temporary layers can both be relatively thick so that each can have an upper portion and a lower portion created through a half-etch or partial-etch process, as illustrated for the temporary layer 130.

Second Phase

In a second phase of methods in accordance with the preferred embodiments and with reference to FIGS. 7A-10D, a grid pattern is pitch reduced and transferred to underlying layers. One example of an etch sequence for this phase is the following: 1) shrink feature (mandrel) widths (to the extent not already shrunk); 2) blanket deposition of spacer material; 3) spacer etch; 4) removal of mandrels; and 5) extension of spacer pattern into underlying material. Another example of an etch sequence for this phase is to skip step 1 because the feature widths have been reduced already in the first phase.

FIGS. 7A-7D show the structure of FIGS. 6A-6D after an etch (e.g., an isotropic carbon etch) has reduced the widths of the remaining portions of the first temporary layer 130. The width of the grid lines formed in the lower portion 134 has been reduced. Furthermore, the width of the pillars 620 formed in the upper portion 132 has been reduced, forming narrow pillars 720. Thus, the masking lines in both the first (vertical) and second (horizontal) line patterns have been shrunk or reduced so that the spaces in between lines are wider and the lines' widths are diminished, but the pitch of neither the first (vertical) nor the second (horizontal) line pattern has changed.

The grid lines and pillars 620 are preferably reduced in size using an isotropic carbon etch, such as an etch containing $SO_2$ and $O_2$ plasma without bias. The extent of the etch is preferably selected so that the widths of the modified grid lines and narrow pillars 720 are substantially equal to the desired spacing between the later-formed spacers 820, as will be appreciated from the discussion of FIGS. 8-9. Advantageously, this etch allows the modified grid lines and narrow pillars 720 to be narrower than would otherwise be possible using the photolithographic technique used to pattern the photodefinable layers 120 and 330. That is, if the lines 122 (FIGS. 1A-2B) and the lines 332 (FIGS. 3A-5D) and other underlying lines derived from these lines are at or near the resolution limit of the photolithographic technique, this etch can reduce their size even further, taking them below that resolution limit. In addition, the etch can smooth the edges of the modified grid lines and narrow pillars 720, thus improving their uniformity.

In some embodiments, the spaces between the grid lines and pillars 620 can be narrowed by expanding the grid lines and pillars 620 to a desired size. For example, additional material (not shown) can be deposited over the grid lines, or the grid lines can be chemically reacted to form a material (not shown) having a larger volume to increase their size.

In the illustrated embodiment, the modified grid lines and narrow pillars 720 define the dimensions of placeholders or mandrels along which a pattern of spacers will be formed after blanket deposition of a spacer material 820 (FIGS. 8A-9D). In alternative embodiments, if the deposition and etch of spacer material is incompatible with the temporary layer 130, the grid pattern can be first transferred to the second temporary layer 140 and the spacer material can be deposited directly on the second temporary layer 140.

The first temporary layer 130 is preferably formed of a material that can withstand the process conditions for spacer material deposition and etch, discussed below. In particular, the material forming the temporary layer 130 preferably has a higher heat resistance than photoresist and is preferably selected such that it can be selectively removed relative to the material for the spacers 820 (FIG. 8) and the underlying second temporary layer 140. As noted above, the first temporary layer 130 is preferably formed of transparent carbon.

As described above, the width reduction of the features can happen in an earlier stage of the process. In this case, the width reduction (or shrink step) illustrated here may be skipped. For example, the widths may already be reduced relative to the spaces in between the crossing lines, leaving larger openings between features.

FIGS. 8A-8E show the structure of FIGS. 7A-7D after deposition and subsequent etching of a spacer material 820. The spacer material 820 (formed from an oxide material, for example) has first been blanket deposited over the narrow grid lines and narrow pillars 720 of FIG. 7. Preferably, the deposition is to a thickness of the desired spacer width, conformally deposited over the mandrels. The spacer material 820 has then been anisotropically etched (using a reactive ion etch, for example) to create a grid of spacers-the spacers adhering to the side walls of the narrow grid lines and the narrow pillars 720. Formation of these spacers has formed a pattern that is pitch multiplied in two dimensions when compared to the pitch of the grid pattern of FIGS. 6 and 7.

Figure 8E:
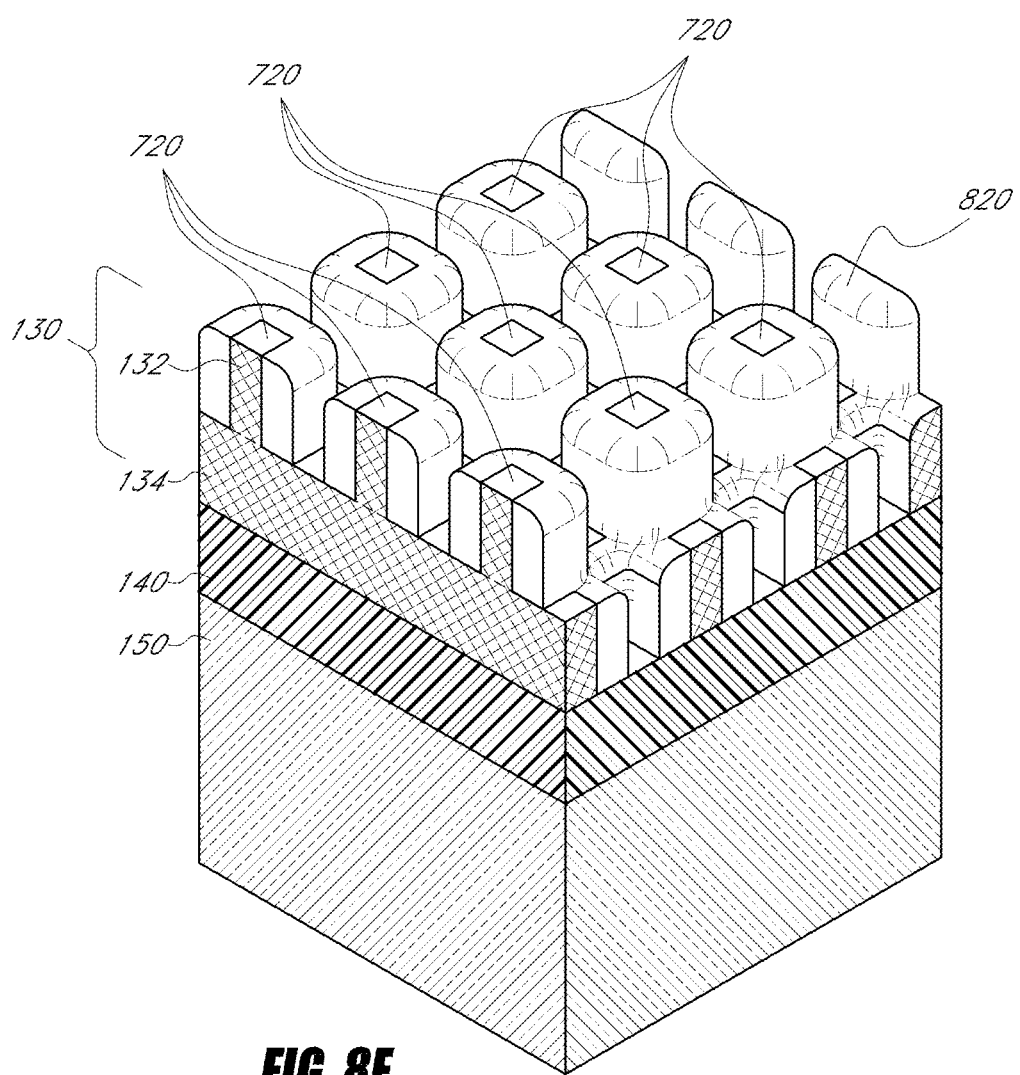
FIG. 8E shows a perspective view of the structure of FIGS. 8A-8D.

FIG. 8E shows a perspective view of the general structure of the contours of spacer material 820 adhered to the side walls of the temporary layer 130. The spacer material 820 adheres to the sides of the columns 720, which are located at the intersections of the rows and columns formed in the lower portion 134 of the temporary layer 130. In this way, lines of spacer material 820 can bridge over each row or column and form a continuous hard-mask grid.

Figure 8F:
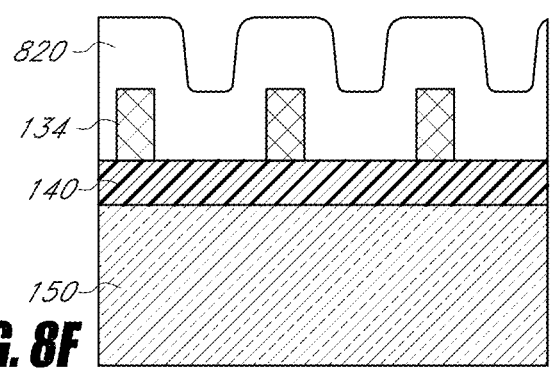
FIG. 8F shows a cross-sectional view of a section of the structure of FIG. 8E.

FIG. 8F shows a section taken through one of the continuous lines of spacer material 820, showing how the spacer material bridging over successive lines in the lower portion 134 of the temporary layer 130.

As shown in FIGS. 8A-8F, a layer of spacer material 820 is preferably blanket deposited so that it conforms to the exposed surfaces, including the walls of the narrow grid lines and the narrow pillars 720. The spacer material can be any material that can act as a mask for transferring a pattern to underlying layers, or that otherwise can allow processing of underlying structures through the mask being formed. The spacer material preferably: 1) can be deposited with good step coverage; 2) can be deposited at a temperature compatible with the first temporary layer 130 and underlying layers; and 3) can be selectively etched relative to the first temporary layer 130 and any layer directly underlying the first temporary layer 130. Preferred materials include silicon, silicon oxides, and nitrides. High aspect ratio process (HARP) oxides can also be used. HARP oxides can be deposited at relatively low temperatures with high conformality. The spacer material is preferably deposited by chemical vapor deposition or atomic layer deposition to a thickness corresponding to the desired width of the mask features, which in the illustrated embodiment is between about 20-60 nm and, more preferably, about 20-50 nm. Preferably, the step coverage is about 80% or greater and, more preferably, about 90% or greater. The spacer etch can comprise an anisotropic etch to remove spacer material from horizontal surfaces. The spacer etch can be performed using a fluorocarbon plasma (e.g., $CF_4/CHF_3$, $C_4F_8/CH_2F_2$ or $CHF_3/Ar$). Fluorocarbon plasmas such as these can be used with an amorphous silicon hard mask, carbon mandrels, and silicon oxide spacers, for example. The spacer etch can also be performed using HBr/Cl plasma for a silicon spacer material.

As described above, some embodiments have feature patterns with lines that have been reduced in width before the patterns are transferred to underlying layers. Thus, photoresist lines can undergo a direct shrink step. Such an approach can provide for well-defined corners in a grid pattern and provide for features (e.g., square holes and square pillars) with flat surfaces. These surfaces can provide large surface areas. This good coverage can, in turn, allow for improved functionality in a final product. For example, a capacitor configured in a hole with flat sides and sharper corners can have a higher capacitance than a hole with more rounded corners.

FIGS. 9A-9D show the structure of FIGS. 8A-8E after remaining exposed portions of the first temporary layer have been removed (using a selective carbon etch, for example), leaving a pitch-multiplied, masking grid pattern formed by spacer material. The grid pattern has been extended into the underlying second temporary layer 140 with a selective etch (e.g., a DARC etch) that does not attack the oxide of the spacers 820 (formed from HARP oxide, for example), thus creating holes that expose isolated portions of the underlying substrate layer 150 (which can be formed from silicon or silicon oxide, for example). In this way, features of one pattern are removed to leave behind another pattern formed by the spacers.

Thus, in some embodiments, pitch-reduction has been performed using a spacer material to create masking features. The masking features formed in this way can have a smaller pitch than the photoresist lines and can comprise pitch-reduced masking lines separated by pitch-reduced spaces; pitch multiplication has been accomplished. In the illustrated embodiment, the pitch of the pattern formed by spacers is roughly half that of the pattern corresponding to definable lines 122 and 332 (FIGS. 1A-5D), where the pitch was originally determined by photolithography. Preferably, a spacer pattern having a pitch of about 50-150 nm can be formed (e.g., 100 nm pitch where original lithography defined a 200 nm pitch).

As illustrated, after a spacer etch is performed, it can leave behind a grid pattern of spacer material 820 having effectively reduced pitch relative to the grid pattern of spacer mandrels (the lines and pillars of the temporary layer 130). After the pillars 720 and the remaining exposed portions of the temporary layer 130 have been removed, what remains is a mask pattern formed from spacer material 820. The mask pattern comprises a pitch-multiplied grid of spacer material 820 having pairs of crossing lines forming intersections. The pairs of crossing lines are the spacer lines that had adhered to each column or row of the grid and each pillar 720. When the columns and rows of the grid are removed, the spacer line pairs remain. The spacer line pairs intersect where the pillars 720 had been at the intersections of the grid rows and columns. However, after removal of the pillars 720 as well as the directly underlying mandrel grid at the intersection upon which the pillars 720 had stood, the spacer line pairs form the tall side-walls of deep holes 920 and shallow holes 930. The depth of the deep holes 920 correspond to the height of the pillars 720 that have been removed. Holes of a similar depth are also formed in between the two members of each spacer line pair, in between the portions of spacer material 820 that had adhered to adjacent pillars 720 prior to removal of the temporary layer 130.

The line pairs of spacer material also form the side walls of shallower holes at other regions of the array. The depth of the shallow holes 930 correspond to the height of the lines in the grid of spacer material, exposed portions of which have been removed. For example, the lines of spacer material form side-walls of shallow holes 930 where the underlying second temporary layer 140 was already exposed, even before removal of remaining exposed portions of the temporary layer 130. These shallow holes 930 are formed between separate pairs of spacer lines. Holes 930 of a similar depth are also formed in between the two members of each spacer line pair, where the row mandrel or column mandrel was located prior to removal of the temporary layer 130.

FIGS. 10A-10D show the structure of FIGS. 9A-9D after the remaining portions of the spacer material 820 and remaining portions of the first temporary layer 130 (up until now protected under the spacers 820) have been removed with one or multiple selective etches, leaving behind a pitch-multiplied mask grid formed from the second temporary layer 140. The mask grid has regularly-spaced holes 1012 that reveal isolated portions of the underlying substrate 150. FIG. 10A shows a schematic plan view of the surface. After this etch step, the second temporary layer 140 exhibits features that were present in two distinct overlying patterns:

the first (vertical or column) line pattern and the second (horizontal or row) line pattern.

One or multiple etch steps can be used to remove the remaining portions of the overlying layers to achieve the structure illustrated in FIGS. 10A-10D. Alternatively, a single etch step can remove all of the overlying layers at once with a CMP process, a sputter etch, a dry etch, a reactive ion etch, or any chemistry or process that removes everything but the materials of the layers 140 and 150. In the illustrated embodiment, the spacer material 820 and the remaining portions of the layer 130 have been completely removed in FIGS. 10A-10D, leaving a masking grid sitting atop the layer 150. The masking grid has small holes 1012 that can occur at regular intervals in two dimensions (see FIG. 10A).

In some embodiments, the holes 1012 have a slightly rectangular footprint. In some embodiments, the footprints of the features are square—that is, the length and width of the features are approximately the same in overhead plan view. In some embodiments, the features have a first width of less than approximately 50 nanometers and a first length of approximately 1.5 times the first width, for a width to length ratio of approximately 1:1.5. More generally, the width to length ratio is preferably between about 1:1 and 1:2. Thus, preferred embodiments form features that are isolated, rather than continuous lines. Pitch multiplication of a pattern in one dimension can result in pitch multiplied lines, but pitch multiplication of crossing patterns can result in small, dense, isolated features. Pitch multiplication of crossing patterns can be particularly advantageous when the pitch multiplication occurs in a consolidated step after the crossing patterns have already been consolidated or combined in two levels (upper and lower portions 132 and 134) of a single layer (130), for example. The features having a length that is not many times longer than the feature's width are thus different from lines, which may have a length thousands of times their width, for example. Preferred embodiments have features with a less-elongate footprint, instead having a more square-shaped footprint.

The features preferably are spaced apart at intervals of less than approximately 50 nm. In one advantageous embodiment, the isolated features each have a rectangular footprint with dimensions of approximately 50 nm by approximately 75 nm. In another advantageous embodiment, the isolated features each have a square footprint with dimensions of approximately 50 nm by approximately 50 nm.

In some embodiments, the processes and method described above provide the advantage of a single shrink step and/or a single spacer process to produce a pitch-multiplied pattern in two dimensions. For example, rather than shrinking a first line pattern, depositing spacer material on the mandrels, removing the mandrels, and then repeating the process on a separate pattern, two or more distinct line patterns can be shrunk in a single etch, spacer material can be deposited on mandrels for the various patterns in a single deposition step, and the mandrels for the various patterns can be removed in a single etch. Thus, fewer steps can be used to accomplish isolated features that have been pitch multiplied in two dimensions.

Third Phase

In a third phase of methods in accordance with preferred embodiments and with reference to FIGS. 11-12, the grid of mask material (in the illustrated embodiment the patterned second temporary layer 140) is used to create features in or on the substrate 150. In other arrangements, the hard mask 140 can be omitted and the spacer patterns of FIG. 8 (after removal of the mandrels) can be used directly as the mask.

FIGS. 11A-11B show the structure of FIGS. 10A-10B after the pattern of holes 1012 in the second temporary layer 140 has been extended into the substrate 150, the second temporary layer 140 has been removed, and the corresponding holes in the substrate have been filled with a conductive material 1120. In this example, the substrate 150 comprises an upper insulating layer and the openings in the substrate expose lower circuit elements to which contact is desired (e.g., source/drain regions of transistors). The conductive material 1120 preferably substantially fills the holes 1012 in the substrate 150 and overflows to form a continuous overflow layer, as illustrated. The conductive material 1120 can be any electrically conducting or semi-conducting material. In a preferred embodiment, the conductive material 1120 is doped polysilicon. In some embodiments, the conductive material 1120 can be a conductive metal such as tungsten, copper, or aluminum. The conductive material 1120 often includes multiple sublayers. For example, a titanium adhesion layer, a metal nitride barrier layer, and a metal filler layer can all be used in combination.

FIGS. 12A-12B show the structure of FIGS. 11A-11B after the overflow conductive material has been etched back to the surface of the substrate 150. Preferably, the overflow material is removed using a CMP process. In some embodiments, a hard mask layer (not shown) can be deposited between the second temporary layer 140 and the substrate 150 to act as a CMP stop. Some embodiments can use a reactive ion etch (RIE) or a sputter etch to remove the overflow material.

After the continuous overflow layer of conductive material 1120 has been removed, portions of the conductive material 1120 form isolated contacts that are densely and/or regularly spaced. Preferred contacts have a pitch width of less than 150 nm. More preferably, such contacts have a pitch width of approximately 100 nm or less. In preferred embodiments, the illustrated substrate grid-that has been patterned from the grid of the second temporary layer 140—provides insulation that separates the contacts from each other. In some embodiments, the holes 1012 can be used to pattern or form other isolated features, such as conductive posts for stud capacitors, trenches for trench capacitors, and/or selective epitaxial posts for transistors.

In some embodiments, the mask holes can be used to pattern features formed from a semiconductor. These features can be formed by selective epitaxy in the mask holes, which can expose portions of a single-crystal silicon layer below the mask layer. The features can comprise vertical surround gate transistors that connect a source region (not shown) in an underlying level to a drain that is part of the isolated semiconductor pillar grown through the mask holes 1012. Thus, the hole can have within it, or the feature can act as, a channel connecting a source region to a drain.

In the illustrated embodiment, the contacts are formed in the extension of the holes 1012 into the substrate 150, as described above. As is apparent from the details set forth above, the dimensions of each contact are advantageously determined by the resolution of a spacer pattern formed using the spacer material 820. In some embodiments, the contacts have a symmetrical, square footprint. In some embodiments, the contacts are shaped to correspond to the features they are designed to contact.

In some alternative embodiments, circuit elements can be formed by filling the mask grid itself with material. For example, the modified layer 140 (the grid with holes that overlies the substrate 150) can be filled directly with conductive material instead of extending the holes 1012 into the underlying substrate layer 110. Once the modified second temporary layer 140 has been filled with conductive material, the overflow conductive material can be removed and the second temporary layer 140 can be removed to leave freestanding conductive contacts on the substrate 150. The spaces between contacts can then be filled with an insulating material such as oxide (not shown). However, as described above, in some embodiments, the pattern of modified layer 140 is first extended into the upper portion of the substrate 150 (such as an ILD), and contacts are formed at the lower level.

In some embodiments, the holes 1012—whether extended into the substrate 150 or in an overlying layer—are configured to receive an electrically conductive material such as metal. Furthermore, when used in formation of an integrated circuit, the holes 1012 are preferably positioned to allow formation of an electrically conductive contact that connects underlying features such as transistor source regions with other components (for example, bit lines) in an overlying level.

In some embodiments, the contacts can have different configurations. For example, the features may have corners that are less sharply-defined than those of the illustrated contacts in FIG. 12B. Furthermore, the proportions, shape, spacing, height, width, and contours of the contacts may vary from the illustration in FIG. 12B.

In certain embodiments, the contacts are polysilicon plugs. In advantageous embodiments, the contacts connect elements of memory arrays; however, such contacts can connect portions of any electrical device or component to any other electrical device or component. The skilled artisan will readily appreciate other applications for employing the mask with a dense pattern of holes.

An alternative way to form a grid structure that can be used for making contacts is to fill the holes 1012 with a cap material (not shown) that can be selective etched with respect to the second temporary layer 140, polish back any overflow cap material, selectively remove grid formed by the second temporary layer 140, leaving islands of the cap material in place. This inverse mask pattern can then be used, for example, to form pillars of the substrate 150 by etching away the portions of the substrate 150 that are not protected by the islands of cap material. These pillars can, in turn be used to create a grid if the space between the pillars is filled with another material and the pillars are removed. Using these positive and negative approaches in turn, while masking off adjacent portions of the array, pillars or posts and grids can be formed in adjacent portions of an array.

In some embodiments, pillars or posts can be formed from a semiconducting material. For example, carbon islands can be used as a mask to etch silicon pillars in an underlying semiconducting substrate. In an alternative embodiment, the second temporary layer 140 can be omitted and the holes 1012 can be formed directly in the substrate 150, which can be a silicon wafer or a blanket epitaxial layer.

In some embodiments, the holes 1012 can be extended into or formed directly in the substrate 150. The resulting holes in the substrate 150 can thus be the features formed by methods described above. In some advantageous embodiments, the resulting holes in the substrate 150 can be lined with a dielectric material and can function as portions of capacitors, for example.

In other non-limiting examples of applications, the holes 1012 or corresponding holes in the substrate 150 can be filled with phase change materials, which change conductivity with switchable changes in phase, in a process to form phase change memories; programmable conductor memories (PCRAM); or filled with fusable materials (e.g., positively or negatively doped polysilicon or metals) in a process to form programmable read only memories (PROMs); etc. Phase change memories are memories having a material which can be switched between relatively conductive and insulating states by the application of heat. Exemplary phase change materials include germanium, antimony and tellurium alloys (also referred to as GeSbT or GST). Programmable conductor RAM (PCRAM) are dendritic memories having a programmable conductor, e.g., chalcogenide glass doped with silver or other high mobility metal, which can be switched between a conductive and nonconductive state by the application of an electric field. For example, the conductors can cause shorts in the glass when an electric field is applied in one direction and can dissolve back into an amorphous glass phase when an opposite electric field is applied. Fusable materials, e.g., aluminum and polysilicon in PROMs can be used as fuses, which are retained or "blown" as desired to establish a desired conductive state in the memory. In other embodiments, electrical devices and/or parts thereof, such as capacitors, may be formed using the voids 310.

EXAMPLE

Figure 13:
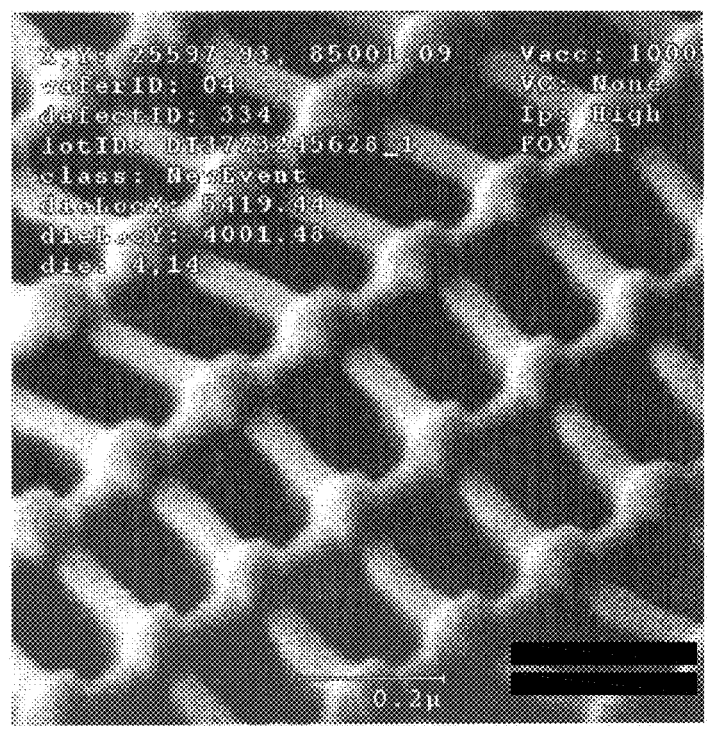
FIG. 13 is a scanning electron micrograph (SEM) illustrating a perspective view of a consolidated grid pattern formed according to the described embodiments.
Figure 14:
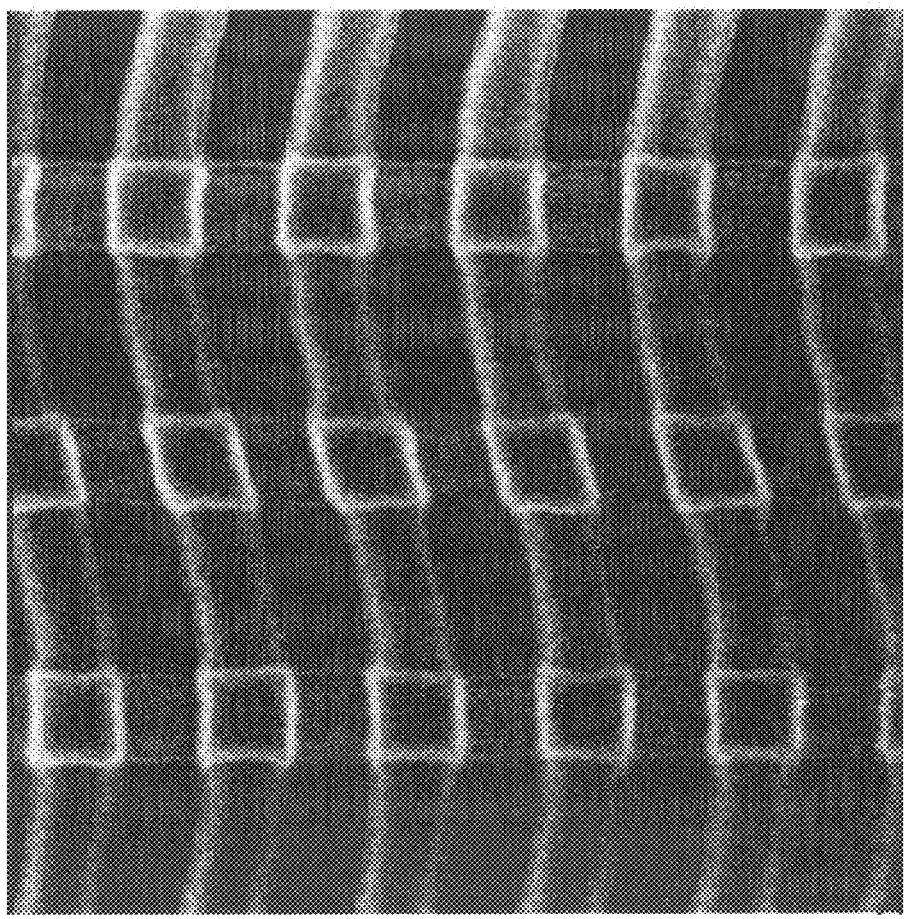
FIG. 14 is a scanning electron micrograph (SEM) illustrating a plan view of a consolidated grid pattern formed according to the described embodiments.

FIGS. 13 and 14 are scanning electron micrographs (SEMs) illustrating a dense array of small holes formed according to the described embodiments. These SEMs show structure that can be used to make holes having a pitch of approximately 200 nm by 250 nm. The features shown have a width of approximately 95 nm in the critical dimension.

To achieve the structure shown, the process described in FIGS. 1-6 was generally followed, with the exception that an extra layer of DARC was used above the temporary layer 130. The extra DARC layer was approximately 1200 angstroms (Å) thick. The half-etch process resulting in multiple exposed layers (depicted in FIG. 6E, for example) was accomplished in the DARC layer and then transferred into the underlying temporary layer 130 (which was formed from transparent carbon (TC) in this example). In FIG. 13, the DARC layer has been removed after the pattern was extended into the TC layer. In this example, the TC is approximately 3,000 Å thick and overlies an oxide layer. The underlying oxide layer in this example is approximately 20,000 Å thick and is PSG oxide.

In this example, the first pattern (generally corresponding to the lines 122 in FIG. 1 above) was a serpentine (wavy line) pattern with a pitch of approximately 195 nm. The next crossing pattern (generally corresponding to the lines 332 of FIG. 3) had a pitch of approximately 293 nm. Thus, in some embodiments, holes resulting from these two patterns can be approximately 98 nm by approximately 147 nm. The pitch doubling process can thus produce features of approximately 50 nm by 75 nm with the structure shown here.

The SEM of FIG. 13 was taken while the subject surface was tilted at 45 degrees and rotated 45 degrees. Pillars have been formed where the two line patterns cross. These pillars correspond to the narrow pillars 720 schematically illustrated above (see FIG. 7).

The SEM of FIG. 13 has features that do not line up directly, but are offset in a regular wavy pattern. Because of this wavy pattern, the grid pattern may not be precisely square or rectangular as illustrated schematically in the figures above. As this figure illustrates, there are many embodiments and configurations covered by the inventions disclosed herein.

FIG. 14 is an SEM illustrating a dense array of small holes formed according to the described embodiments. FIG. 14 shows a plan view wherein the features have a pitch of approximately 200 nm by 250 nm.

The principles and advantages discussed herein are applicable to a variety of contexts in which two or more mask patterns are juxtaposed or consolidated in a crossing configuration and combined to form circuit features such holes or pillars.

Accordingly, it will be appreciated by those skilled in the art that various other omissions, additions and/or modifications may be made to the methods and structures described above without departing from the scope of the invention. All such modifications and changes are intended to fall within the scope of the invention, as defined by the appended claims.

I claim:

1. A method of semiconductor processing, comprising:
    forming a mandrel on an underlying substrate, comprising:
        on a first level of the substrate, forming a grid of intersecting lines of material over an upper surface of the substrate, the grid of intersecting lines comprising first lines extending along a first direction and second lines extending along a second direction that crosses the first direction, the first and second lines extending to a first elevation above the upper surface of the substrate; and
        on a second level of the substrate, forming pillars on the substrate that extend upwards- from intersections of the intersecting lines to a second elevation above the upper surface of the substrate; and
    forming spacers on the substrate at sidewalls of the mandrel, the spacers being formed on sidewalls of the intersecting lines and on sidewalls of the pillars, wherein forming spacers comprises:
    blanket depositing a layer of spacer material over the mandrel;
    and directionally etching the layer of spacer material to define the spacers at the sidewalls of the mandrel.

2. The method of claim 1, wherein the spacers form loops around the pillars and around interior walls of the grid of intersecting lines.

3. The method of claim 2, wherein the spacers extend continuously from the first level to the second level.

4. The method of claim 1, wherein the intersecting lines comprise a first plurality of lines orthogonal to a second plurality of lines.

5. The method of claim 1, wherein forming the spacers exposes upper surfaces of the mandrel, and further comprising selectively removing exposed portions of the mandrel.

6. The method of claim 1, wherein the grid of intersecting lines and the pillars are formed of a same material.

7. The method of claim 6, wherein the grid of intersecting lines and the pillars comprise amorphous carbon.

8. The method of claim 1, wherein the spacers comprise an oxide.

9. The method of claim 1, wherein forming the mandrel comprises etching a single layer of material, wherein the grid of intersecting lines and the pillars are formed in that layer of material.

10. A method of semiconductor processing, comprising:
    forming first lines extending along a first direction over an upper surface of a substrate and second lines extending along a second direction, the second lines crossing the first lines to form a grid of intersecting lines of a single sacrificial material;
    forming pillars on the substrate that extend upwards from the intersections of the intersecting lines of sacrificial material; and
    forming spacers on the substrate at sidewalls of the grid and pillars, wherein forming spacers comprises:
    blanket depositing a layer of spacer material over the mandrel;
    and directionally etching the layer of spacer material to define the spacers at the sidewalls of the mandrel.

11. The method of claim 10, further comprising:
    preferentially etching exposed portions of the pillars and the grid of intersecting lines to leave a pattern defined by the spacers; and
    transferring the pattern to an underlying material.

12. The method of claim 11, wherein transferring the pattern forms holes in the underlying material.

13. The method of claim 12, further comprising depositing conductive material into the holes.

14. The method of claim 12, further comprising depositing phase change material into the holes.

15. The method of claim 11, wherein transferring the pattern defines an array of features in a memory array.

16. The method of claim 14, wherein the memory array is a flash memory array.

17. The method of claim 10, wherein the spacers have a width of about 20-60 nm.

18. The method of claim 10, wherein the sacrificial material is a carbon-containing material.

19. The method of claim 18, wherein the carbon-containing material is amorphous carbon.

* * * * *